US012506016B2

(12) United States Patent
Hata

(10) Patent No.: US 12,506,016 B2
(45) Date of Patent: Dec. 23, 2025

(54) METHOD OF MANUFACTURING SEMICONDUCTOR DEVICE USING DIFFERENT TYPES OF PLATING FILMS

(71) Applicant: RENESAS ELECTRONICS CORPORATION, Tokyo (JP)

(72) Inventor: Toshiyuki Hata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 358 days.

(21) Appl. No.: 18/170,672

(22) Filed: Feb. 17, 2023

(65) Prior Publication Data

US 2023/0352313 A1    Nov. 2, 2023

(30) Foreign Application Priority Data

Apr. 28, 2022    (JP) .................. 2022-075074

(51) Int. Cl.
*H01L 21/48* (2006.01)
*H01L 21/02* (2006.01)
*H01L 21/768* (2006.01)
*H01L 23/00* (2006.01)
(Continued)

(52) U.S. Cl.
CPC .... *H01L 21/4821* (2013.01); *H01L 21/02175* (2013.01); *H01L 21/76817* (2013.01); *H01L 23/49503* (2013.01); *H01L 24/03* (2013.01); *H01L 2021/60015* (2013.01); *H01L 2224/05124* (2013.01); *H01L 2224/05144* (2013.01);
(Continued)

(58) Field of Classification Search
CPC ........... H01L 21/4821; H01L 21/76817; H01L 23/49503; H01L 23/49582; H01L 23/49562; H01L 23/49575

USPC ..................................................... 438/758
See application file for complete search history.

(56) References Cited

U.S. PATENT DOCUMENTS 9,147,647 B2    9/2015    Kaneda
2005/0231925 A1    10/2005    Fukuda et al.
(Continued)

FOREIGN PATENT DOCUMENTS

JP    2005-353976 A    12/2005
JP    2012-222185 A    11/2012
(Continued)

OTHER PUBLICATIONS

Office Action dated Jul. 15, 2025, issued in corresponding Japanese Patent Application No. 2022-075074, 11 pages.

*Primary Examiner* — Quoc D Hoang
(74) *Attorney, Agent, or Firm* — Rimon P.C.

(57) ABSTRACT

In a frame member including a first region and a second region that are extending in a first direction in parallel to each other while being spaced apart from each other, first and second plating films are formed in the first and second regions, respectively. The second plating film is different in a type from the first plating film. Then, a stamping process is performed to the frame member including the first region and the second region, thereby a lead frame including a plurality of leads is formed. The lead frame includes a first lead group and a second lead group. The first plating film is formed in the first lead group, but the second plating film is not formed in the first lead group. Meanwhile, the second plating film is formed in the second lead group, but the first plating film is not formed in the second lead group.

9 Claims, 24 Drawing Sheets

(51) Int. Cl.
*H01L 23/495* (2006.01)
*H01L 21/60* (2006.01)
(52) U.S. Cl.
CPC ............... *H01L 2224/13639* (2013.01); *H01L 2224/13655* (2013.01)

(56) References Cited

U.S. PATENT DOCUMENTS

| | | | |
|---|---|---|---|
| 2014/0329360 A1* | 11/2014 | Kim | H01L 23/49582 438/123 |
| 2021/0118781 A1 | 4/2021 | Hasegawa et al. | |
| 2022/0077082 A1 | 3/2022 | Osumi et al. | |

FOREIGN PATENT DOCUMENTS

| | | |
|---|---|---|
| JP | 2014-093431 A | 5/2014 |
| JP | 2021-068783 A | 4/2021 |
| JP | 2022-046253 A | 3/2022 |

* cited by examiner

<TOP VIEW>

<SIDE VIEW>

METHOD OF MANUFACTURING SEMICONDUCTOR DEVICE USING DIFFERENT TYPES OF PLATING FILMS

CROSS-REFERENCE TO RELATED APPLICATION

The disclosure of Japanese Patent Application No. 2022-075074 filed on Apr. 28, 2022, including the specification, drawings and abstract is incorporated herein by reference in its entirety.

BACKGROUND

The present invention relates to a technique of manufacturing a semiconductor device, and relates to a technique effectively applied to, for example, a technique of manufacturing a semiconductor device using two types of plating films.

There is disclosed techniques listed below.
[Patent Document 1] Japanese Unexamined Patent Application Publication No. 2014-93431

Japanese Unexamined Patent Application Publication No. 2014-93431 (Patent Document 1) describes a technique of using a plating film containing nickel as a main component and a plating film containing gold as a main component.

SUMMARY

For example, there is a technique of packaging two semiconductor chips into one package to be one semiconductor device. In this technique, one semiconductor chip (referred to as "first semiconductor chip") and one lead are connected to each other by a first bonding wire while the other semiconductor chip (referred to as "second semiconductor chip") and the other lead are connected to each other by a second bonding wire. In this case, a material configuring the bonding wire connected to the first semiconductor chip and a material configuring the bonding wire connected to the second semiconductor chip are different from each other in some cases. In other words, in the semiconductor device formed by packaging two semiconductor chips into one package, the bonding wires made of two different types of materials may be used.

In order to secure reliability of the connection between the bonding wire and the lead, a plating film is formed on a surface of the lead. In this case, in accordance with the material of the bonding wire, a type of the plating film formed on the surface of the lead is selected. Therefore, in the semiconductor device using the bonding wires made of two different types of materials, two different types of plating films are used.

From the studies of the present inventors, it has been found that the technique of manufacturing the semiconductor device using two different types of plating films has a room for improvement in a point of view of improvement of the reliability of the manufactured semiconductor device. Therefore, in the technique of manufacturing the semiconductor device using two different types of plating films, it is desirable to make a contrivance for the improvement of the reliability of the semiconductor device.

A method of manufacturing a semiconductor device according to one embodiment includes: a step (a) of preparing a frame member including a first region and a second region, the first region and the second region being extending in a first direction in parallel to each other while being spaced apart from each other; a step (b) of forming a first plating film in the first region; a step (c) of forming a second plating film in the second region, the second plating film being different in a type from the first plating film; and a step (d) of, after the steps (b) and (c), performing a stamping process to the frame member, thereby forming a plurality of device regions each including a part of the first region and a part of the second region. In this case, each of the plurality of device regions formed in the step (d) includes a first die pad, a second die pad, a plurality of first leads arranged in the first direction, and a plurality of second leads arranged in the first direction. And, the plurality of first leads, the first die pad, the second die pad and the plurality of second leads are arranged in a second direction crossing the first direction. Each of the plurality of first leads includes the part of the first region but does not include the part of the second region, and each of the plurality of second leads includes the part of the second region but does not include the part of the first region.

According to one embodiment, reliability of a semiconductor device can be improved.

BRIEF DESCRIPTIONS OF THE DRAWINGS

DETAILED DESCRIPTION

The same components are denoted by the same reference signs throughout all the drawings for describing the embodiments, and the repetitive description thereof will be omitted. Note that hatching is used even in a plan view so as to make the drawings easy to see.

<Configurations of Power Transistor and Control Circuit>

Figure 1:
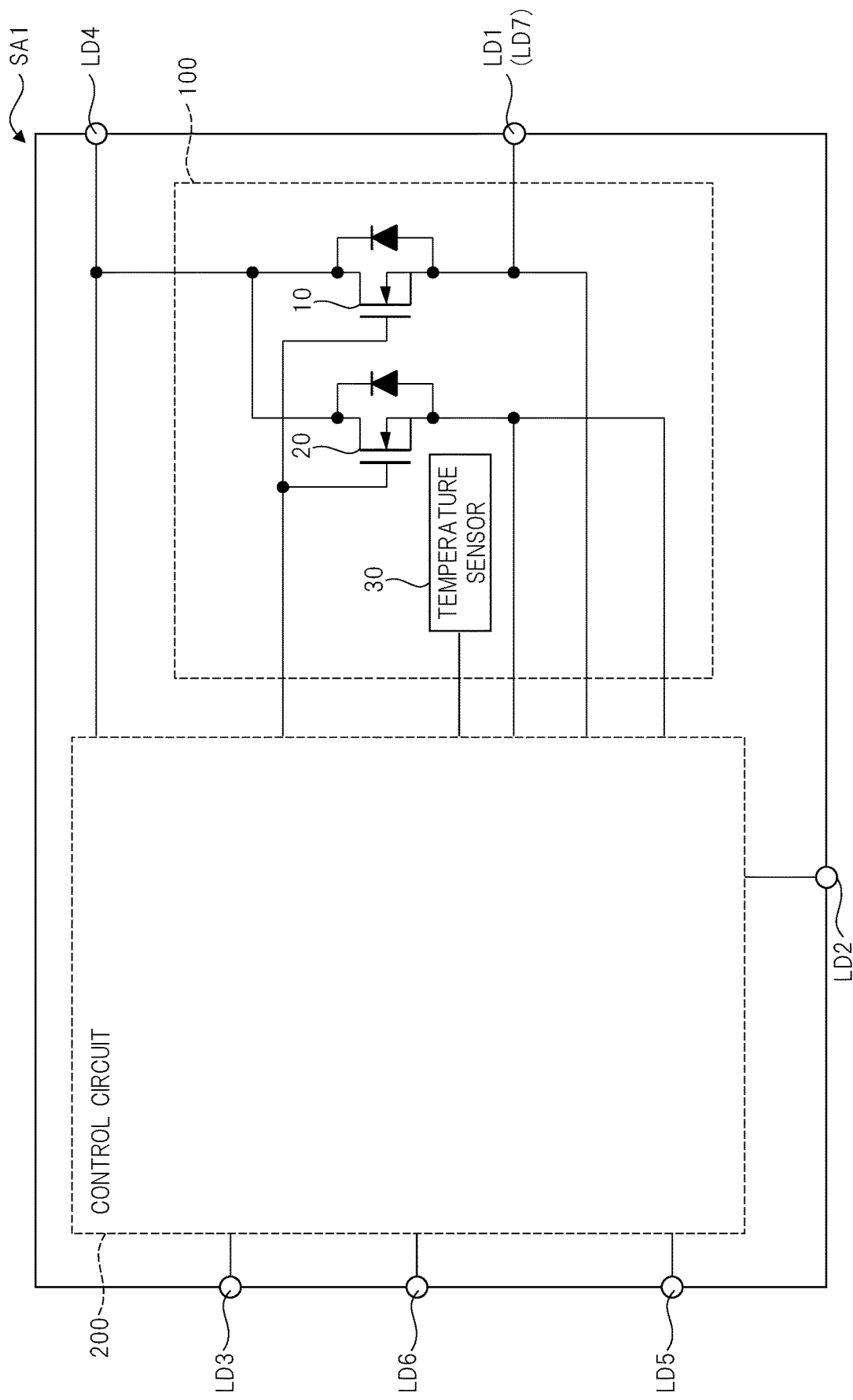
FIG. 1 is a diagram showing a circuit configuration of a semiconductor device including a power transistor and a control circuit controlling the power transistor.

FIG. 1 is a diagram showing a circuit configuration of a semiconductor device SA1 including a power transistor and a control circuit controlling the power transistor.

In FIG. 1, the semiconductor device SA1 includes a switching circuit 100 and a control circuit 200, the switching circuit 100 includes a main transistor 10 made of a power transistor, a sensing transistor 20 and a temperature sensor 30.

In the switching circuit 100 configured as described above, the main transistor 10 is arranged between a lead LD4 that is a power supply terminal supplying a power supply potential and a lead LD1 (lead LD7) that is an output terminal, and functions as a switching element for switching ON/OFF of electric current flowing between the power supply terminal and the output terminal. Meanwhile, the sensing transistor 20 has a function of detecting a current value of the electric current flowing in the main transistor 10, and the temperature sensor 30 has a function of detecting temperature of the switching circuit 100.

Subsequently, the control circuit 200 has a function of controlling the switching circuit 100, and includes, for example, a pre-driver for applying a gate voltage to a gate electrode of the main transistor 10 and a gate electrode of the sensing transistor 20. In FIG. 1, the control circuit 200 is electrically connected with leads LD3 and LD6 that are input terminals of the semiconductor device SA1, a lead LD2 that is a ground terminal and a lead LD5 that is an output terminal for outputting an output of the control circuit 200 to outside of the semiconductor device SA1.

The control circuit 200 is configured to control ON/OFF of the main transistor 10 included in the switching circuit 100, based on a control signal input through the lead LD3. In other words, the control circuit 200 controls the ON/OFF of the main transistor 10 by switching the gate voltage applied to the gate electrode of the main transistor 10.

In this manner, by the control of the ON/OFF of the main transistor 10, the electric current can be supplied to a load connected to the outside of the semiconductor device SA1 through the lead LD1 that is the output terminal electrically connected with a source of the main transistor 10.

A circuit configuration is made in the semiconductor device SA1 as described above.

<Study on Improvement>

The above-described semiconductor device SA1 includes the switching circuit 100 and the control circuit 200. In this case, regarding the package structure of the semiconductor device SA1, there is a technique of packaging a first semiconductor chip on which the switching circuit 100 is formed and a second semiconductor chip on which the control circuit 200 is formed into one package. In this technique, a source pad of the first semiconductor chip and the first lead are connected to each other by a first bonding wire while a pad of the second semiconductor chip and the second lead are connected to each other by a second bonding wire in some cases.

In this case, since a large current is flown in the first semiconductor chip, an aluminium wire containing aluminium as a main component and having a large diameter is often used as the first bonding wire connecting the source pad of the first semiconductor chip and the first lead.

On the other hand, since a large current is not flown in the second semiconductor chip as different from the first semiconductor chip, a gold wire containing gold as a main component and having a small diameter is often used as the second bonding wire connecting the pad of the second semiconductor chip and the second lead.

For example, in the case of the connection between the aluminium wire and the first lead, a nickel plating film containing nickel as a main component is formed on a surface of the first lead in order to secure the connection reliability of the aluminium wire. On the other hand, in the case of the connection between the gold wire and the second lead, a silver plating film containing silver as a main component is formed on a surface of the second lead in order to secure the connection reliability of the gold wire. In the package structure formed by packaging the first semiconductor chip and the second semiconductor chip as described above, two different types of plating films are used in accordance with the usage of the bonding wires made of two different types of materials.

First, a technique of forming the plating film on the surface of the lead will be explained below.

<<Spot Plating Method>>

Figure 2:
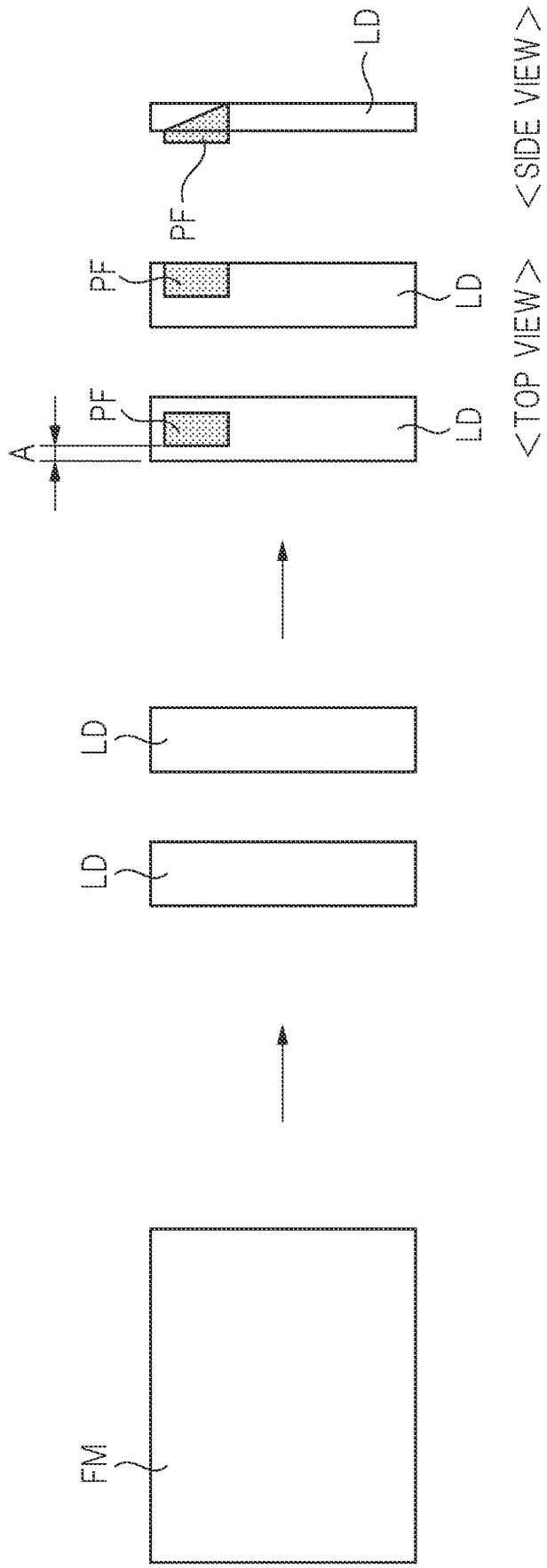
FIG. 2 is a diagram for conceptually explaining a "spot plating method".

FIG. 2 is a diagram for conceptually explaining a "spot plating method".

In the "spot plating method" in FIG. 2, a frame member FM is prepared, and then, a lead LD is formed by performing a stamping process (punching process) to this frame member FM, and a plating film PF is formed on a surface of this lead LD by using a mask.

The "spot plating method" needs a clearance "A" in consideration of positional shift of the mask. However, if this clearance A is narrow, "plating leakage" may be caused on a side surface of this lead LD. The worst case causes a risk of leakage of the plating to outside of the package structure. Particularly when the plating film PF is the silver plating film, the leakage of the silver plating film to outside of the package structure causes a risk of silver migration, and thus, a risk of short circuit failure between adjacent leads.

Figure 3:
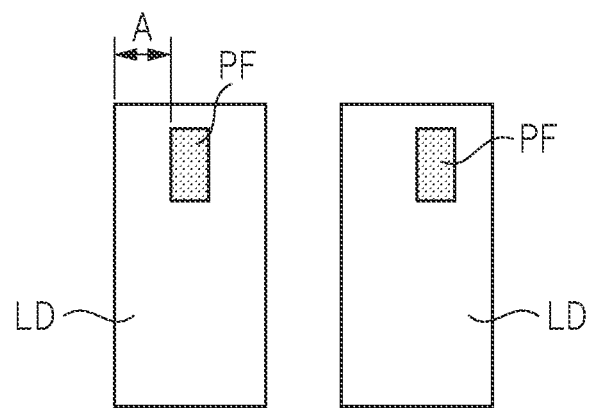
FIG. 3 is a diagram showing one example of a countermeasure against "plating leakage".

Accordingly, in the "spot plating method", in order to suppress the "plating leakage" due to the positional shift of the mask, for example, a method of increasing a width of the lead LD as shown in FIG. 3 for securement of the clearance A is considerable. In this manner, even if the positional shift of the mask occurs, the probability of the "plating leakage" can be reduced. However, since the size of the lead LD increases, a size of the semiconductor device (package structure) undesirably increases.

Figure 4:
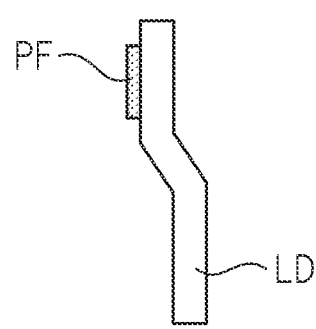
FIG. 4 is a diagram showing one example of a countermeasure against "plating leakage".

Alternatively, a method of performing a bending process to the lead LD as shown in FIG. 4 to form a lead structure avoiding the influence of the "plating leakage" is considerable. However, in this case, the step of bending the lead is added, and a manufacture cost of the lead frame undesirably increases.

Therefore, the following "stripe plating method" has been studied as an alternative technique of the "spot plating method". Therefore, this "stripe plating method" will be explained.

<<Stripe Plating Method>>

Figure 5:
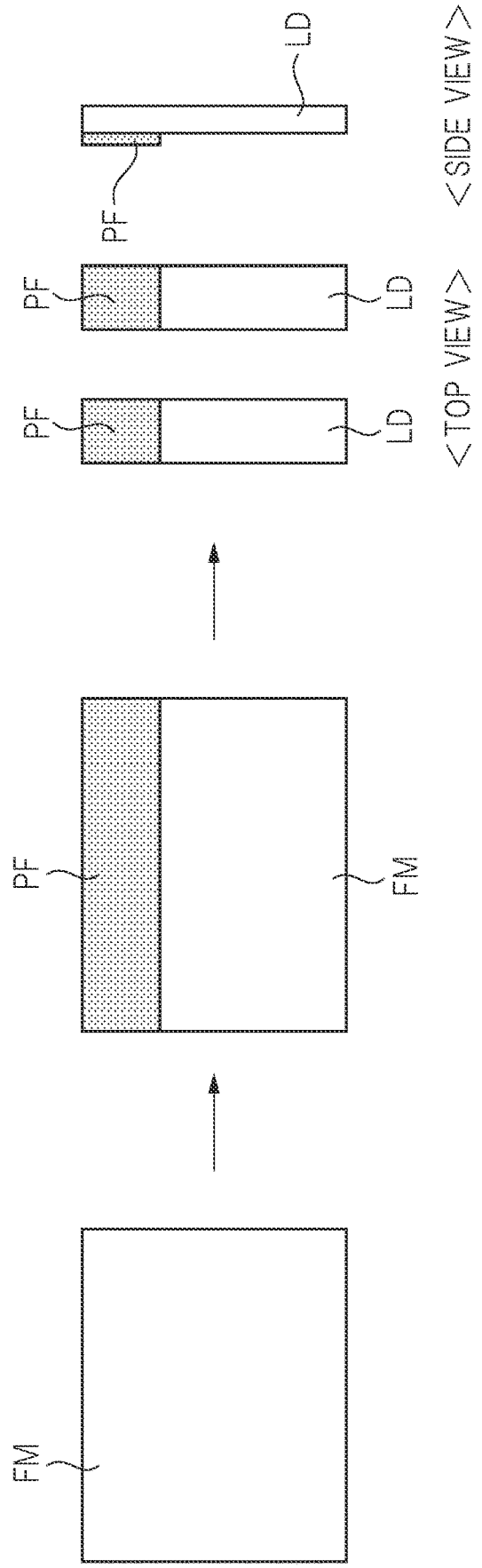
FIG. 5 is a diagram for conceptually explaining a "stripe plating method".

FIG. 5 is a diagram for conceptually explaining the "stripe plating method".

In the "stripe plating method" in FIG. 5, the frame member FM is prepared, and then, the lead LD is formed by forming a line-shaped (stripe-shaped) plating film PF on this frame member FM, and then, performing the stamping process to the frame member FM including the plating film PF formed thereon. Such a "stripe plating method" does not cause the risk of the "plating leakage" since the stamping process is performed after the formation of the plating film PF. Therefore, the countermeasure against the "plating leakage" is unnecessary in such a "stripe plating method", and thus, the manufacture cost of the lead frame can be reduced. In other words, it is unnecessary in such a "stripe plating method" to consider the "plating leakage" to the side surface of the lead LD, and therefore, the lead width can be minimized. As a result, there is an advantage capable of downsizing the semiconductor device. Further, in the "stripe plating method", the bending process of the lead is unnecessary, and therefore, there is an advantage capable of reducing the manufacture cost of the lead frame (and thus, the manufacture cost of the semiconductor device).

Accordingly, a related art using the "stripe plating method" having the advantage that cannot be provided by the "spot plating method" will be explained below.

EXPLANATION FOR RELATED ART

The related art described in the present specification is not a publicly-known technique but a technique having issues found by the present inventors as well as a premise technique of the present invention.

Figure 6:
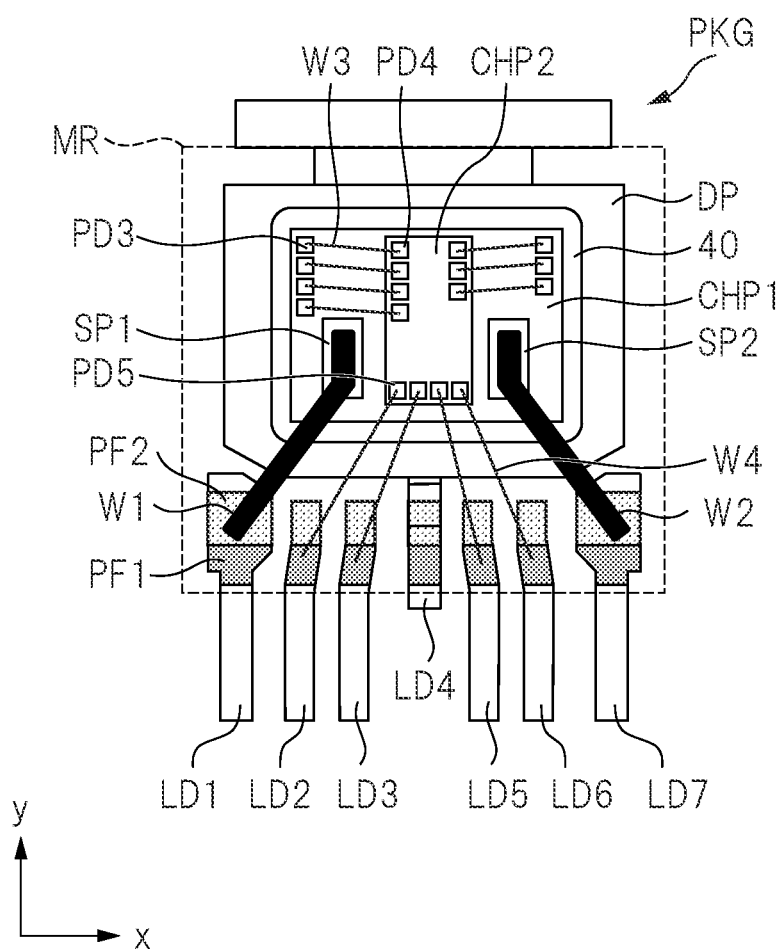
FIG. 6 is a diagram showing a package structure of a related art, the diagram being a top view of the package structure in which a sealing body is transparently viewed.

FIG. 6 is a diagram showing a package structure PKG of the related art, the diagram being a top view of the package structure PKG in which a sealing body MR is transparently viewed.

As shown in FIG. 6, the package structure PKG includes a die pad DP that is a chip mounting portion, and the semiconductor chip CHP1 is mounted on this die pad DP through a conductive bonding member 40 containing solder or silver paste as a raw material. The power transistor is formed on this semiconductor chip CHP1. The semiconductor chip CHP2 is mounted on the semiconductor chip CHP1 through an electrically-insulating bonding member (not illustrated). A control circuit for controlling the power transistor is formed on this semiconductor chip CHP2.

Next, a surface of the semiconductor chip CHP1 includes a first source pad formation region where a source pad SP1 is formed, a second source pad formation region where a source pad SP2 is formed, and a region sandwiched by the first source pad formation region and the second source pad formation region in a plan view, and the semiconductor chip CHP2 is mounted on this sandwiched region through an electrically-insulating bonding member (not illustrated).

The source pad SP1 is connected to the lead LD1 through a thick wire W1. On the other hand, the source pad SP2 is connected to the lead LD7 through a thick wire W2. Further, a plurality of pads PD3 are formed in the semiconductor chip CHP1 while a plurality of pads PD4 and a plurality of pads PD5 are formed in the semiconductor chip CHP2. In this case, each of the plurality of pads PD3 is connected to each of the plurality of pads PD4 through a wire W3, and each of the plurality of pads PD5 is connected to the lead LD2, the lead LD3, the lead LD5 or the lead LD6. The die pad DP is connected to the lead LD4.

Subsequently, as shown in FIG. 6, an outer lead portion of each of the leads LD1 to LD7 protrudes from the sealing body MR. The package structure PKG of the related art is mounted and configured as described above.

In this case, as shown in FIG. 6, the silver plating film PF1 containing silver as a main component and the nickel plating film PF2 containing nickel as a main component are formed in a partial region of each surface of the leads LD1 to LD3 and LD5 to LD7.

Note that the term "main component" described in the present specification means the mostly-contained component, and is used for showing that containing of other components is not excluded. For example, the phrase "containing nickel as a main component" means that the nickel is mostly contained, and the phrase "containing silver as a main component" similarly means that the silver is mostly contained.

The thick wire W1 is connected to the lead LD1 through the nickel plating film PF2, and the thick wire W2 is connected to the lead LD7 through the nickel plating film PF2. On the other hand, a wire W4 is connected to the leads LD2, LD3, LD5 and LD6 through the silver plating film PF1.

In this case, each of the silver plating film PF1 and the nickel plating film PF2 is formed by the "stripe plating method". Specifically, in the related art, a frame member is prepared, and then, a line-shaped (stripe-shaped) silver plating film is formed on this frame member, and then, a line-shaped nickel plating film having a stripe pitch smaller than a stripe pitch of the silver plating film is formed on the stripe-shaped silver plating film. In this manner, the stripe-shaped nickel plating film and the stripe-shaped silver plating film can be formed. Next, the stamping process is performed to the frame member including the silver plating film and the nickel plating film formed thereon. In this manner, a lead frame including the leads LD1 to LD3 and LD5 to LD7 with the silver plating film and the nickel plating film is formed. Then, by using this lead frame, for example, the package structure PKG of the related art shown in FIG. 6 can be manufactured.

<<Room for Improvement>>

Figure 7:
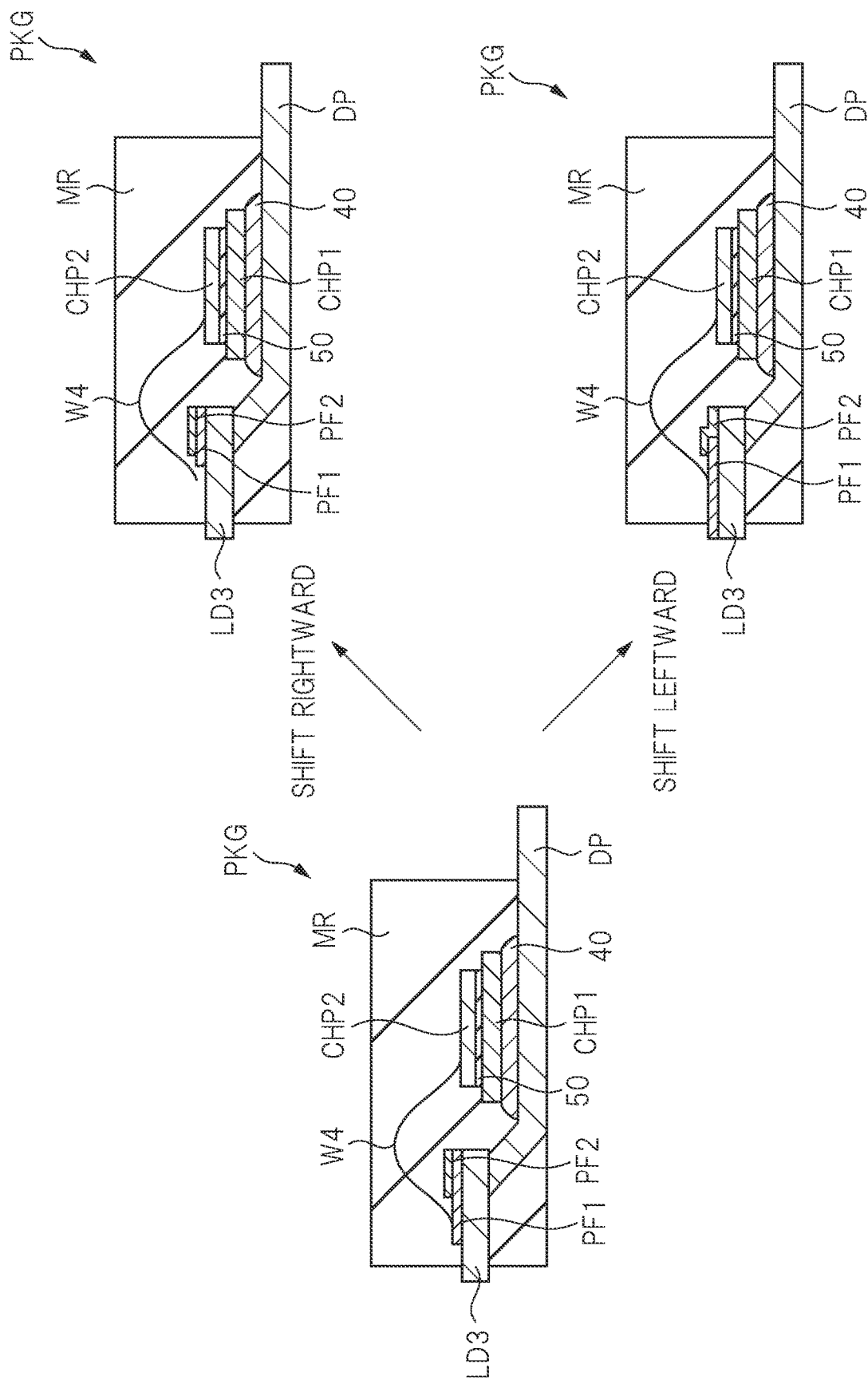
FIG. 7 is a diagram for explaining a room for improvement of the related art.

The package structure PKG of the related art uses two types of plating films formed by the "stripe plating method". For example, as shown in a left drawing of FIG. 7, the stripe-shaped silver plating film PF1 and the stripe-shaped nickel plating film PF2 are formed in the lead LD3. Regarding this point, for example, as shown in an upper right drawing of FIG. 7, if a position of the silver plating film PF1 formed in the lower layer shifts rightward, an exposed region of the silver plating film PF1 is narrowed. As a result, the connection between the wire W4 and the silver plating film PF1 is difficult, and a risk of occurrence of wire peeling arises. On the other hand, for example, as shown in a lower right drawing of FIG. 7, if the position of the silver plating film PF1 formed in the lower layer shifts leftward, the silver plating film PF1 is also formed on the surface of the lead LD3 exposed from the sealing body MR. As a result, this may be a cause of silver migration. Occurrence of the silver migration in the lead LD3 causes the risk of, for example, the short circuit failure between the adjacent leads LD2 and LD3. Therefore, if the position of the silver plating film PF1 formed in the lower layer shifts, the reliability of the package structure PKG is significantly adversely affected.

Figure 8:
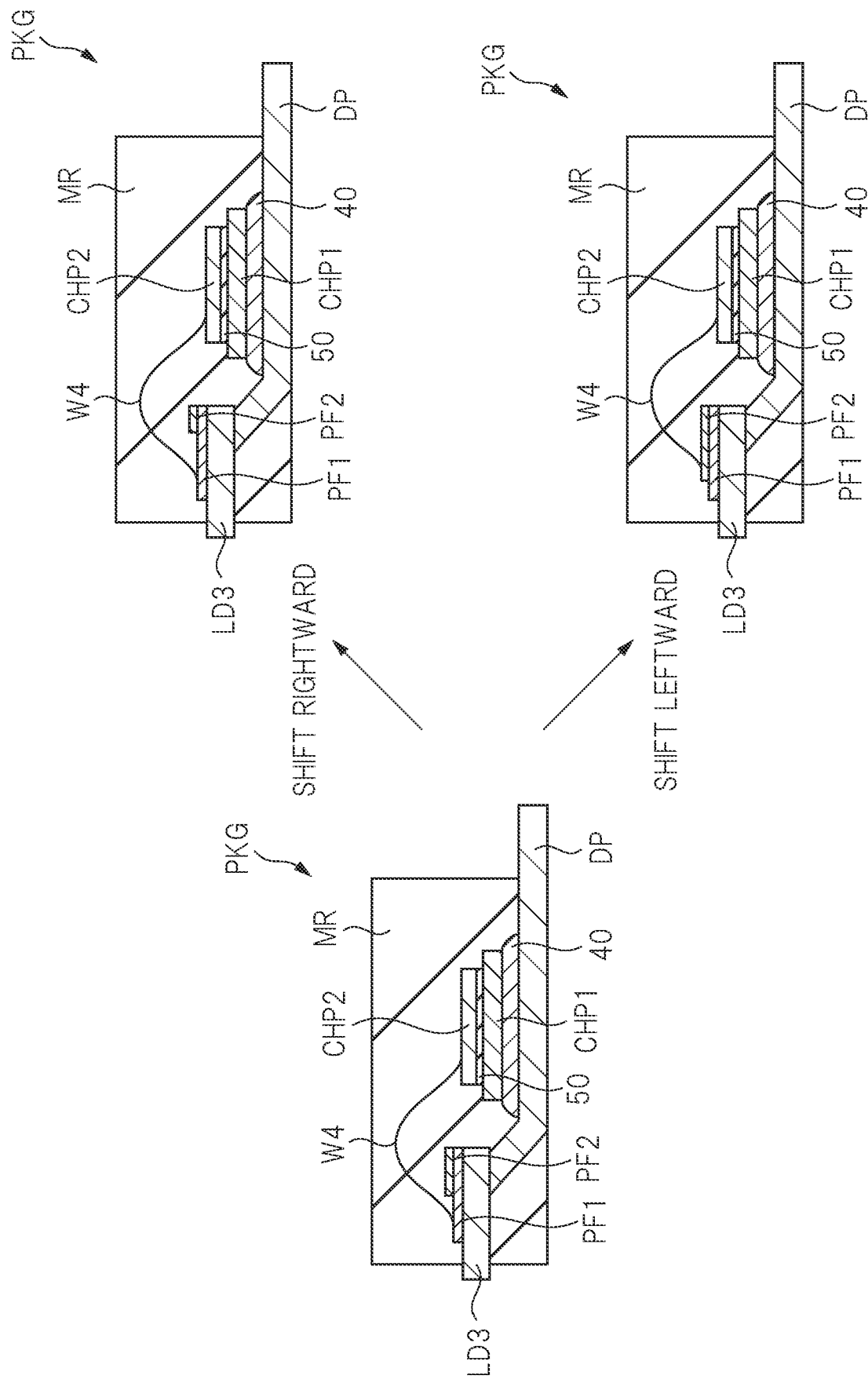
FIG. 8 is a diagram for explaining a room for improvement of the related art.

Similarly, for example, as shown in an upper right drawing of FIG. 8, if the position of the nickel plating film PF2 formed in the upper layer shifts rightward, an exposed region of the nickel plating film PF2 is narrowed. As a result, connection with a thick wire not illustrated is difficult, and the risk of occurrence of wire peeling arises. On the other hand, for example, as shown in a lower right drawing of FIG. 8, if the position of the nickel plating film PF2 formed in the upper layer shifts leftward, the wire W4 is connected onto the nickel plating film PF2. As a result, the risk of occurrence of wire peeling increases. Therefore, also if the position of the nickel plating film PF2 formed in the upper layer shifts, the reliability of the package structure PKG is significantly adversely affected.

As described above, the related art has a room for improvement in a point of view of securement of the reliability of the package structure PKG. Accordingly, in the present embodiment, a contrivance to solve the room for improvement of the related art has been made. A technical idea of the present embodiment with this contrivance will be explained below.

Basic Idea of Embodiment

In a basic idea of the present embodiment, the usage of the "stripe plating method" is on the premise, and is an idea that is not the formation of two types of plating films that are the nickel plating film and the silver plating film in each of the plurality of leads as described in the related art but separation of the plurality of leads into a first lead group where the nickel plating film is formed and a second lead group where the silver plating film is formed.

In other words, the basic idea is an idea in which only either one of the nickel plating film and the silver plating film is formed in the lead by the "stripe plating method".

Specifically, in the basic idea, in the frame member including the first region and the second region extending in the first direction in parallel to each other while being spaced apart from each other, the nickel plating film is formed in the first region by the "stripe plating method", and then, the silver plating film is formed in the second region by the "stripe plating method". Then, the stamping process is performed to the frame member including the first region including the nickel plating film formed thereon and the second region including the silver plating film formed thereon, and therefore, the lead frame including the plurality of leads is formed. In this case, the lead frame includes the first lead group formed by the stamping process to the first region and the second lead group formed by the stamping process to the second region, and only the nickel plating film is formed in the first lead group while only the silver plating film is formed in the second lead group.

In this manner, according to the basic idea, only either one of the nickel plating film and the silver plating film is formed in each of the plurality of leads. Therefore, according to the basic idea, the relative positional shift between the nickel plating film and the silver plating film is not a problem as different from the related art that is the formation of two types of plating film that are the nickel plating film and the silver plating film in each of the plurality of leads. Therefore, according to the basic idea, the wire peeling and the silver migration due to the relative positional shift between the nickel plating film and the silver plating film can be suppressed. As a result, the reliability of the semiconductor device (package structure) can be improved.

An embodied aspect in which the basic idea is embodied will be explained below.

<Configuration of Package Structure (Semiconductor Device)>

Figure 9:
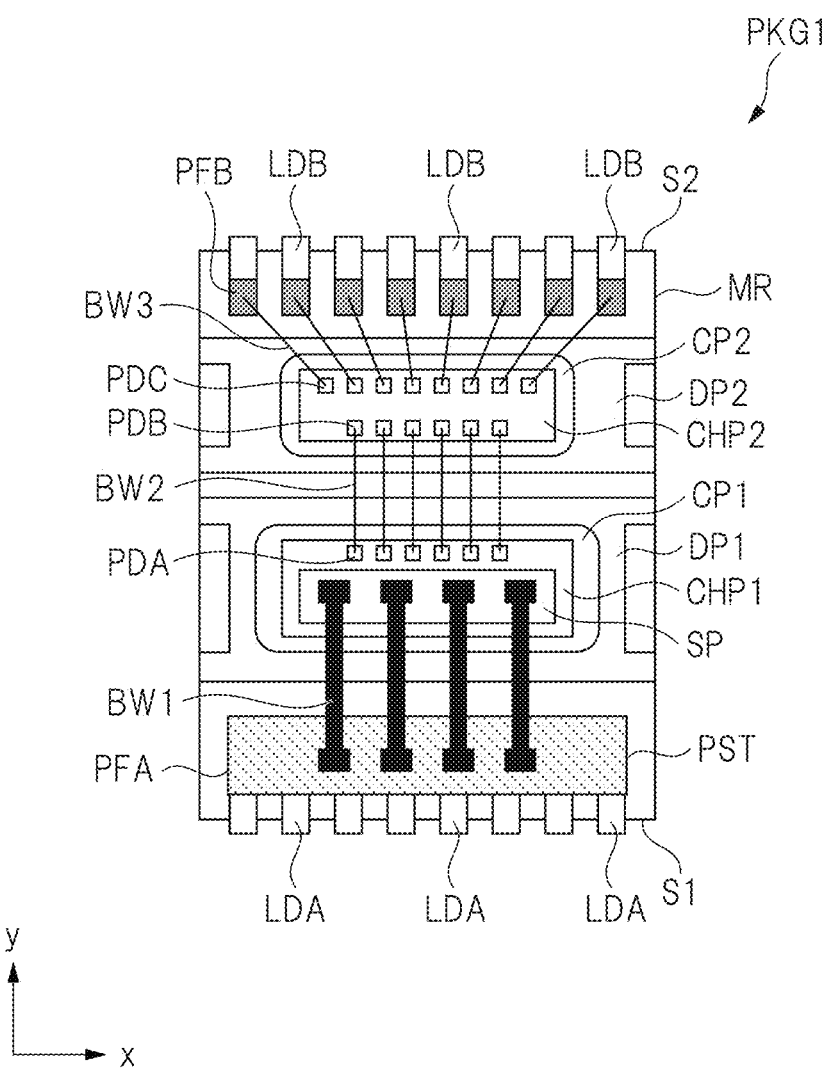
FIG. 9 is a diagram showing a package structure of an embodiment, the diagram being a top view of the package structure in which a sealing body is transparently viewed.

FIG. 9 is a diagram showing a package structure PKG1 of the present embodiment, the diagram being a top view of the package structure PKG1 in which a sealing body MR is transparently viewed.

As shown in FIG. 9, the package structure PKG1 includes a die pad DP1 and a die pad DP2. On the die pad DP1, for example, the semiconductor chip CHP1 including the power transistor formed thereon is mounted. On a surface of the semiconductor chip CHP1, the source pad SP and a plurality of pads PDA are formed. On the other hand, on the die pad DP2, for example, the semiconductor chip CHP2 including the control circuit for controlling the power transistor formed thereon is mounted. On a surface of the semiconductor chip CHP2, a plurality of pads PDB and a plurality of pads PDC are formed.

Next, the package structure PKG1 includes the plurality of leads LDA. The plurality of leads LDA are unified with a post portion PST. On a surface of the post portion PST, a nickel plating film PFA containing nickel as a main component is formed. The plurality of leads LDA is arranged in an "x" direction (first direction).

The package structure PKG1 includes the plurality of leads LDB. On each one end of the plurality of leads LDB, a silver plating film PFB containing silver as a main component is formed. The plurality of leads LDB is also arranged in the x direction.

In this case, the plurality of leads LDA, the die pad DP1, the die pad DP2 and the plurality of leads LDB are arranged in this order in a "y" direction (second direction) crossing the x direction.

Subsequently, as shown in FIG. 9, the source pad SP formed in the semiconductor chip CHP1 and the post portion PST unified with the plurality of leads LDA are connected to each other by a plurality of bonding wires BW1. Each of the plurality of bonding wires BW1 is made of a material containing aluminium as a main component, and each diameter of the same is about 300 μm. In this case, since the nickel plating film PFA is formed on a surface of the post portion PST, the bonding wire BW1 connected to the post portion PST is in contact with the nickel plating film PFA. In this manner, the connection reliability between the bonding wire BW1 and the post portion PST can be improved. In other words, by the connection of the bonding wire BW1 to the nickel plating film PFA, the wire peeling can be suppressed.

Meanwhile, each of the plurality of pads PDA formed in the surface of the semiconductor chip CHP1 and each of the plurality of pads PDB formed in the surface of the semiconductor chip CHP2 are connected to each other by a bonding wire BW2. In this case, the bonding wire BW2 is made of a material containing gold as a main component, and a diameter of the same is about 25 μm.

Next, as shown in FIG. 9, each of the plurality of pads PDC formed in the semiconductor chip CHP2 and each of the plurality of leads LDB are connected to each other by a bonding wire BW3. In this case, each of the plurality of bonding wires BW3 is made of a material containing gold as a main component, and each diameter of the same is about 25 μm. In this case, since the silver plating film PFB is formed on a surface of one end of the lead LDB, the bonding wire BW3 connected to the lead LDB is in contact with the silver plating film PFB. In this manner, the connection reliability between the bonding wire BW3 and the lead LDB can be improved. In other words, by the connection of the bonding wire BW3 to the silver plating film PFB, the wire peeling can be suppressed.

The semiconductor chip CHP1, the semiconductor chip CHP2, the post portion PST, a part of each of the plurality of leads LDA, a part of each of the plurality of leads LDB including one end and the plurality of bonding wires BW1 to BW3 are sealed by the sealing body MR.

In this case, as shown in FIG. 9, the sealing body MR has a rectangular plane shape, and includes a first side S1 extending in the x direction and a second side S2 facing the first side S1. In this case, the plurality of leads LDA is arranged the first side S1 of the sealing body MR, and each of the other portions of the plurality of leads LDA is exposed from only the first side S1. Similarly, the plurality of leads LDB is arranged along the second side S2 of the sealing body MR, and each of the other portions of the plurality of leads LDB is exposed from only the second side S2.

Figure 10:
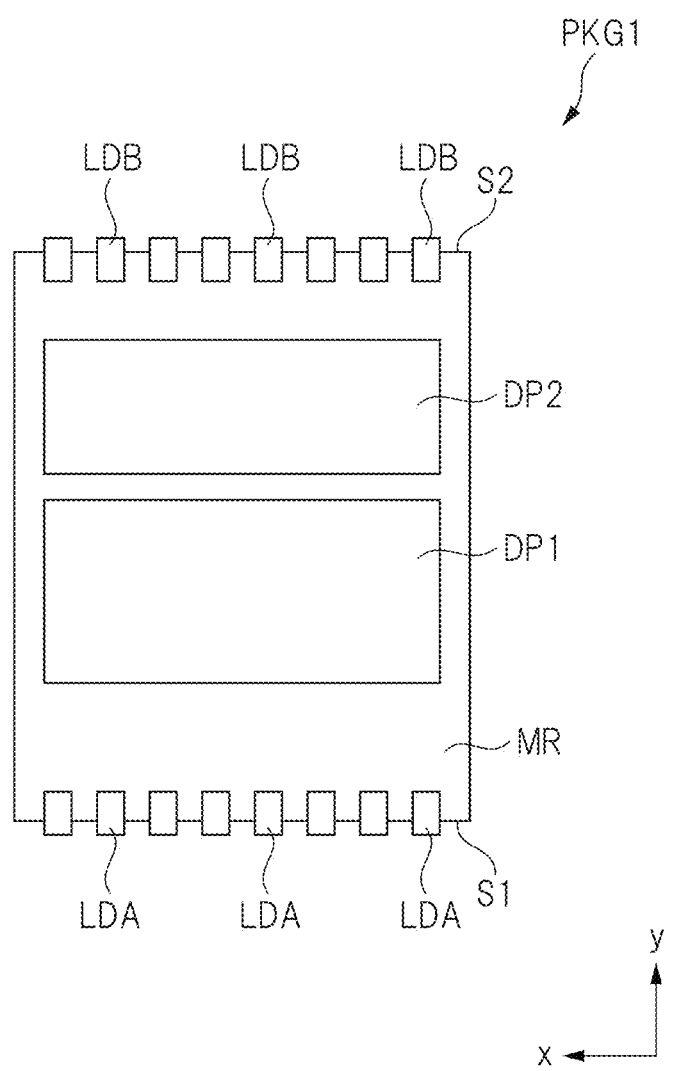
FIG. 10 is a bottom view of the package structure.

Subsequently, FIG. 10 is a bottom view of the package structure PKG1. As shown in FIG. 10, a bottom surface of the die pad DP1 and a bottom surface of the die pad DP2 are exposed from a back surface of the sealing body MR. The package structure PKG1 is configured as described above.

In this explanation, a "SON package (Small Outline Non-leaded package)" has been exemplified as the package structure PKG1. However, the basic idea of the present embodiment can be embodied as a "SOP package (Small Outline Package)".

<Method of Manufacturing Semiconductor Device>

Next, a method of manufacturing the package structure (semiconductor device) PKG1 will be explained.

Figure 11:
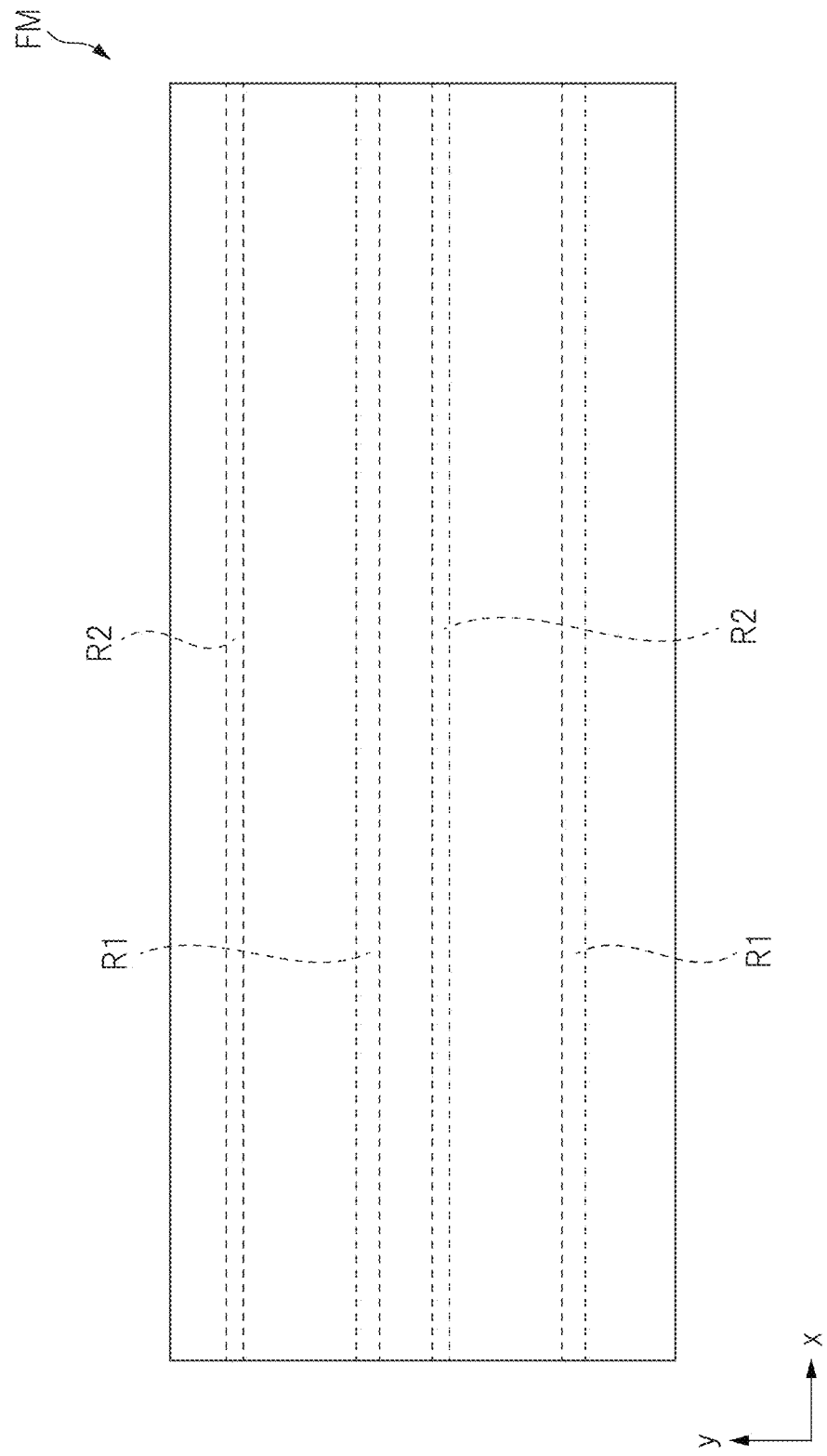
FIG. 11 is a diagram showing a step of manufacturing a semiconductor device.

First, as shown in FIG. 11, the frame member FM including the first region R1 and the second region R2 that are extending in the x direction (first direction) in parallel to each other while being spaced apart from each other is prepared.

Figure 12:
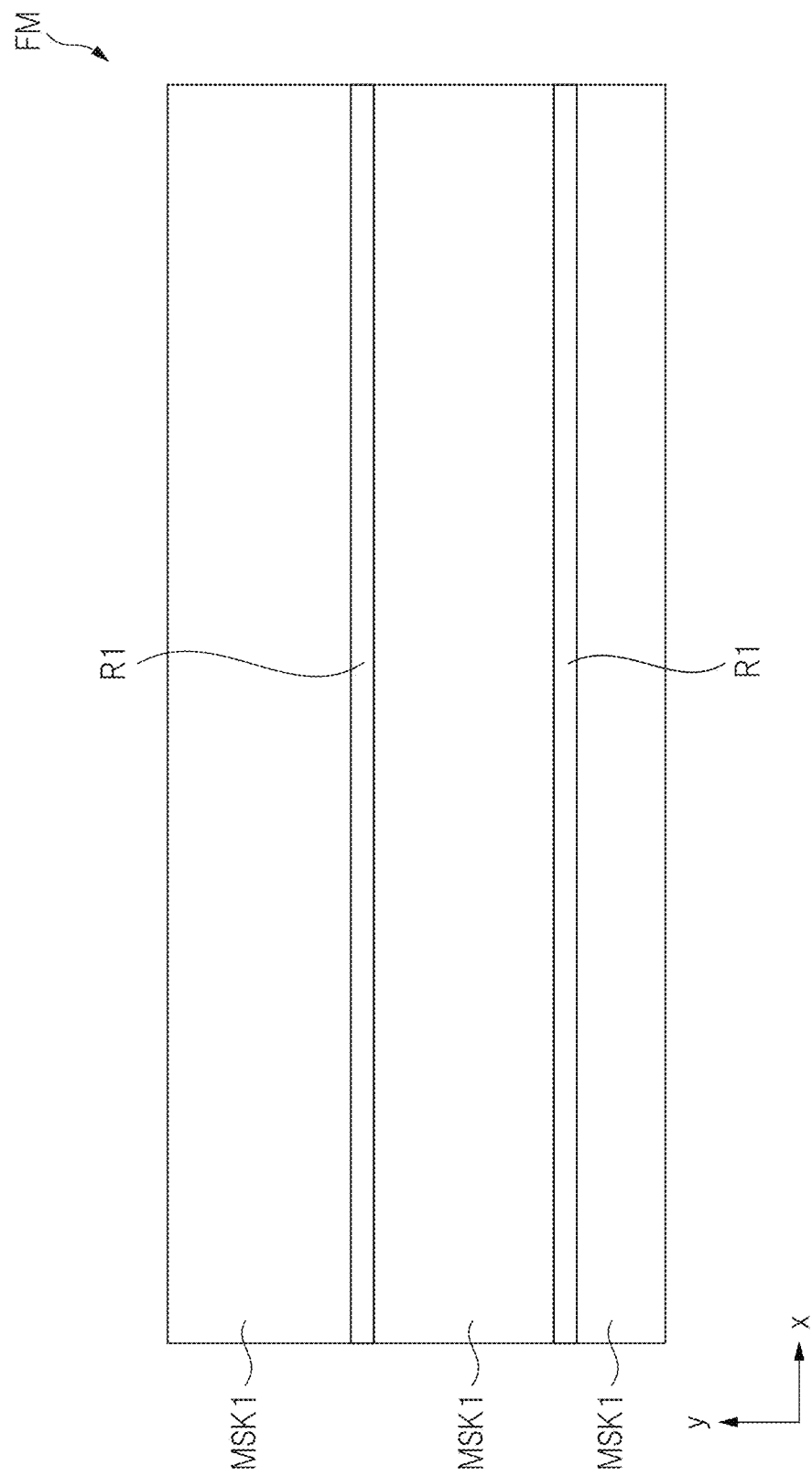
FIG. 12 is a diagram showing a step of manufacturing the semiconductor device, continued from FIG. 11.
Figure 13:
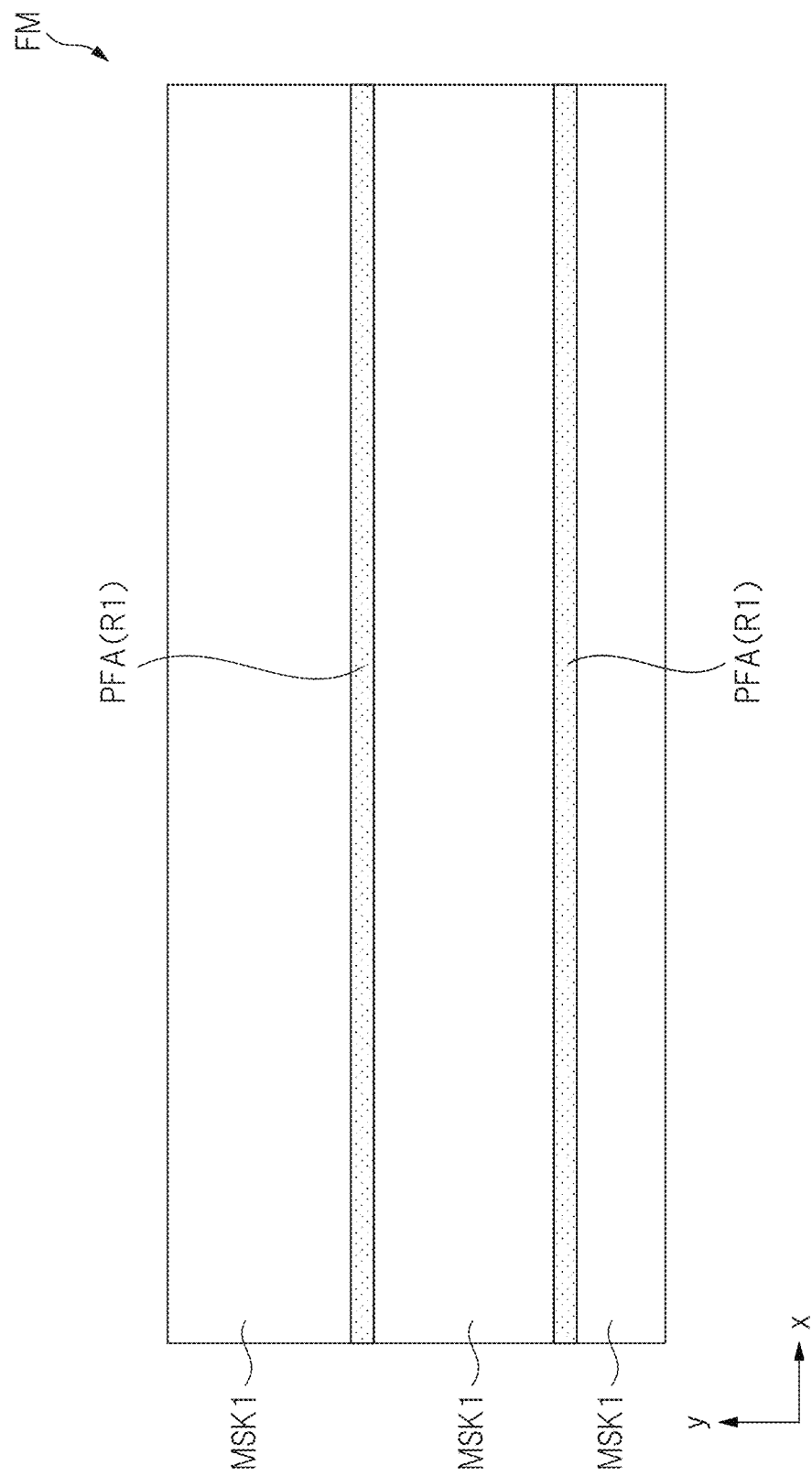
FIG. 13 is a diagram showing a step of manufacturing the semiconductor device, continued from FIG. 12.

Then, as shown in FIG. 12, a masking tape MSK1 is attached to the frame member FM so as to cover other region than the first region R1. Then, the frame member FM with the attachment of the masking tape MSK1 is soaked in first plating solution containing nickel. In this manner, as shown in FIG. 13, the nickel plating film PFA is formed in the first region R1 exposed from the masking tape MSK1.

Figure 14:
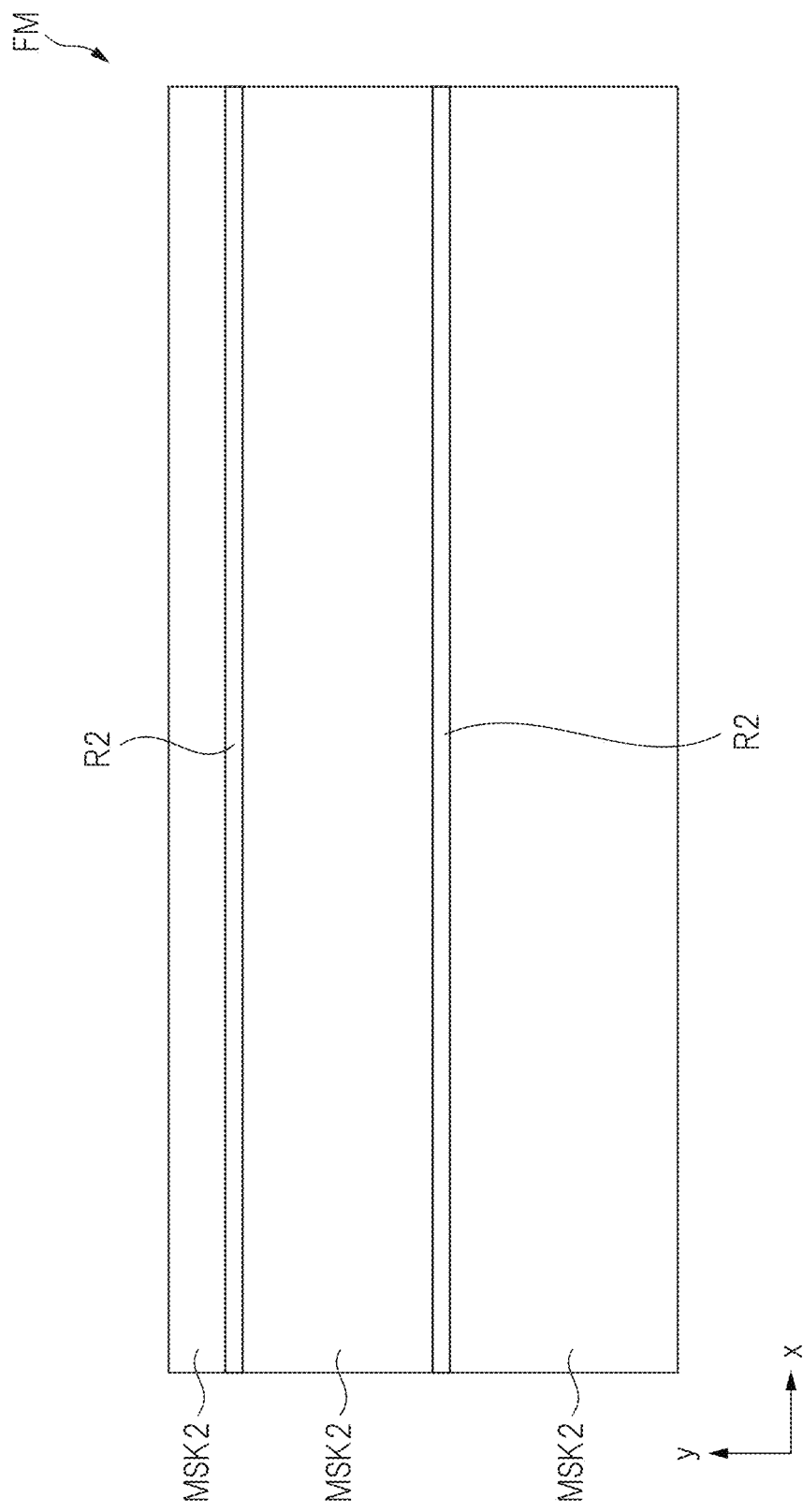
FIG. 14 is a diagram showing a step of manufacturing the semiconductor device, continued from FIG. 13.
Figure 15:
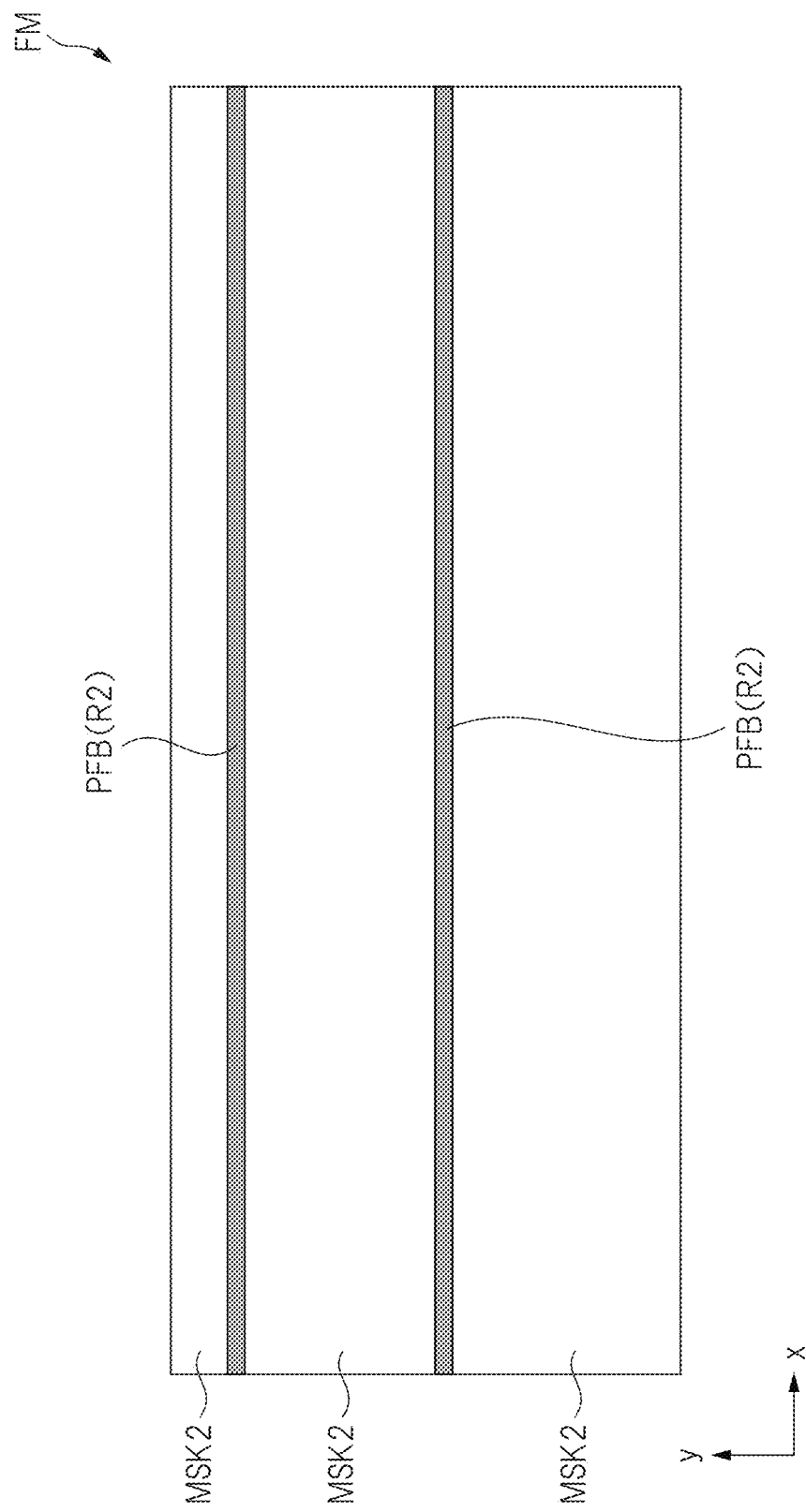
FIG. 15 is a diagram showing a step of manufacturing the semiconductor device, continued from FIG. 14.

Next, the masking tape MSK1 is peeled off from the frame member FM, and then, a masking tape MSK2 is attached to the frame member FM so as to cover other region than the second region R2 as shown in FIG. 14. Then, the frame member FM with the attachment of the masking tape MSK2 is soaked in second plating solution containing silver. In this manner, as shown in FIG. 15, the silver plating film PFB is formed in the second region R2 exposed from the masking tape MSK2.

Figure 16:
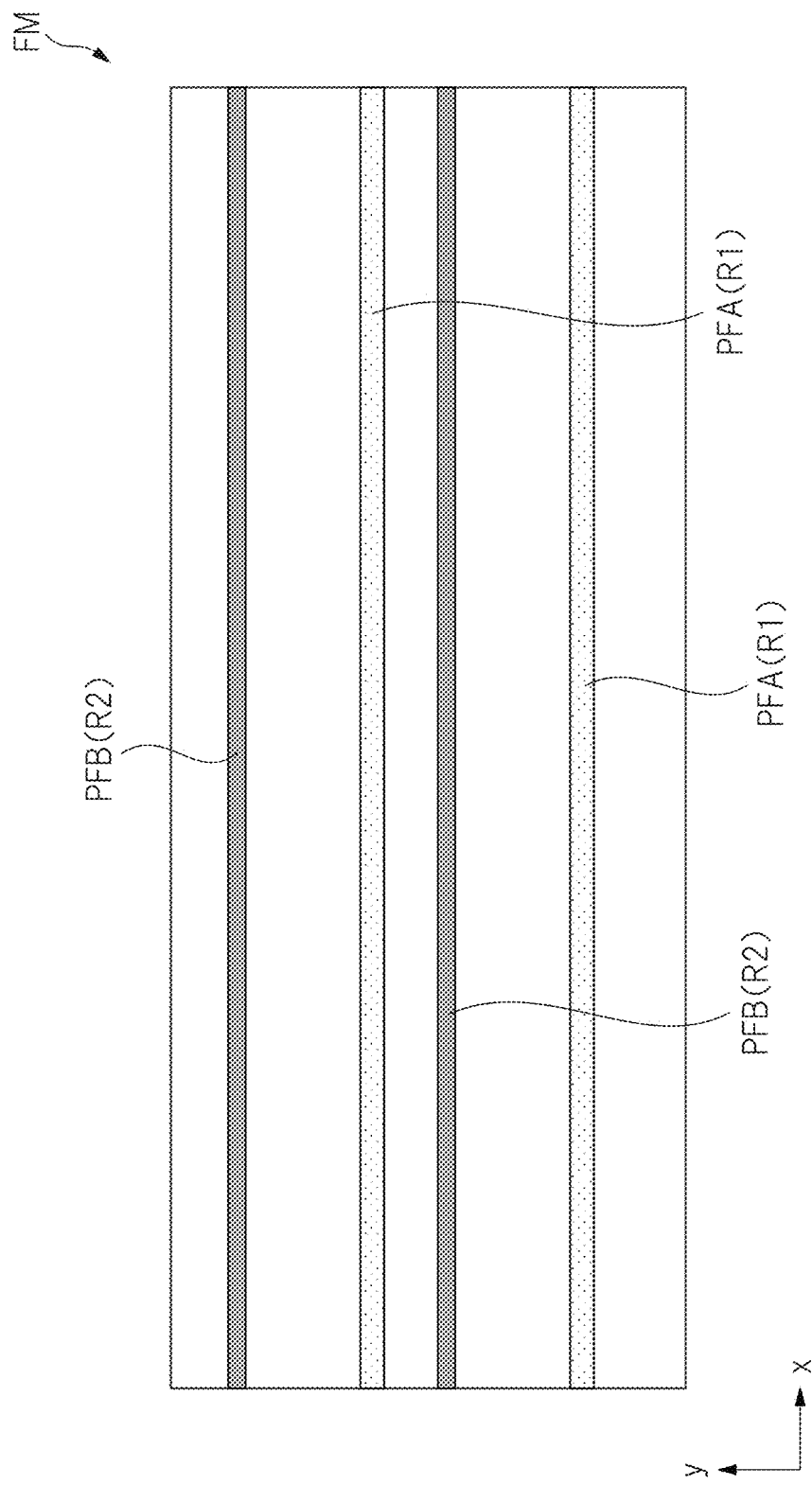
FIG. 16 is a diagram showing a step of manufacturing the semiconductor device, continued from FIG. 15.

Then, the masking tape MSK2 is peeled off from the frame member FM. In this manner, as shown in FIG. 16, the frame member FM including the nickel plating film PFA formed in the first region R1 and the silver plating film PFB formed in the second region R2 can be provided.

Figure 17:
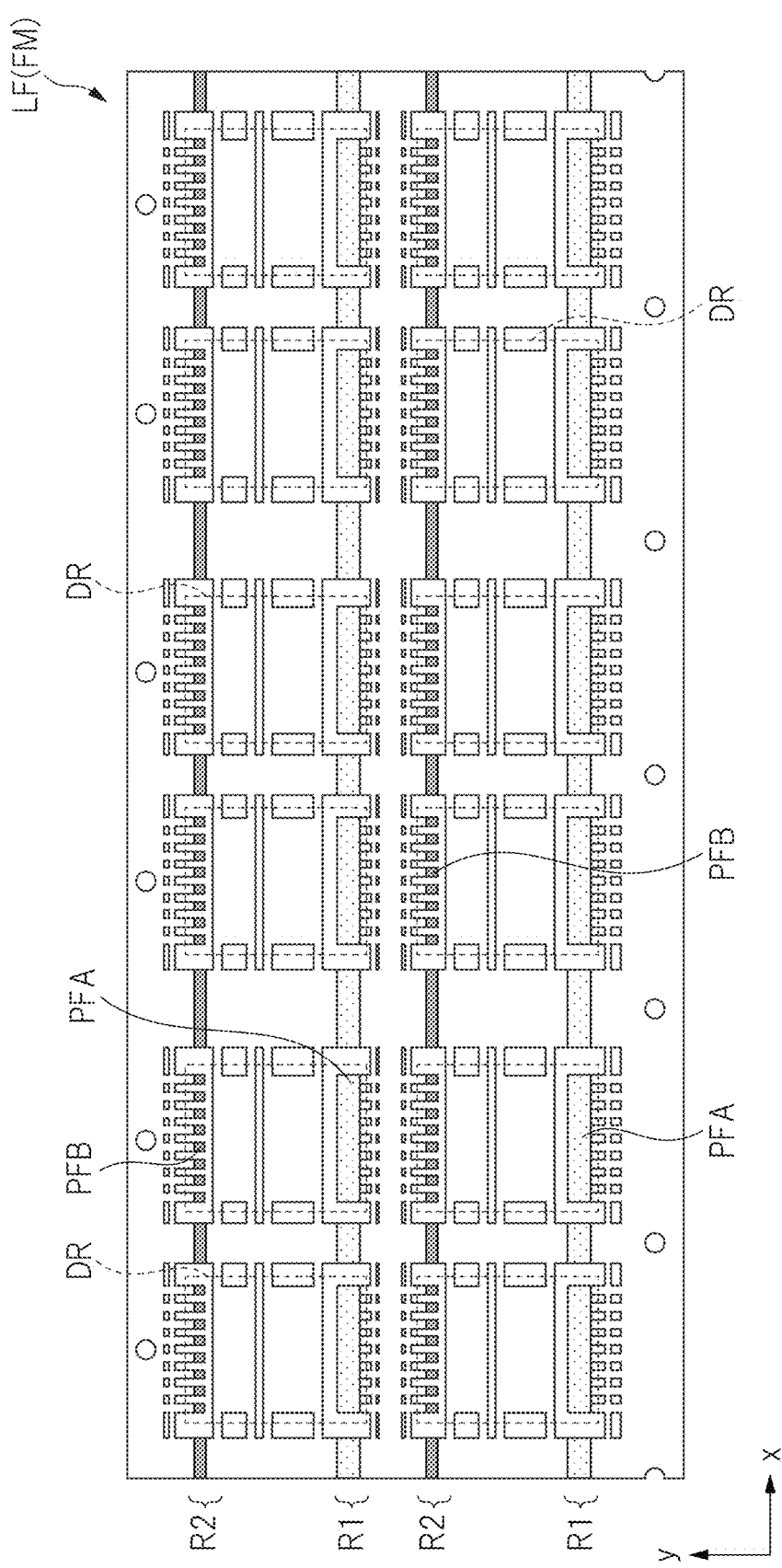
FIG. 17 is a diagram showing a step of manufacturing the semiconductor device, continued from FIG. 16.

Next, the stamping process (punching process) is performed to the frame member FM. In this manner, as shown in FIG. 17, a plurality of device regions DR each including a part of the first region R1 and a part of the second region R2 are formed in the frame member FM. As a result, a lead frame LF that is the frame member FM including the plurality of device regions DR formed therein can be manufactured.

In consideration of the above description, in the step of forming the nickel plating film PFA shown in FIG. 13, the nickel plating film PFA is formed over the plurality of device regions. Similarly, in the step of forming the silver plating film PFB shown in FIG. 15, the silver plating film PFB is formed over the plurality of device regions.

Figure 18:
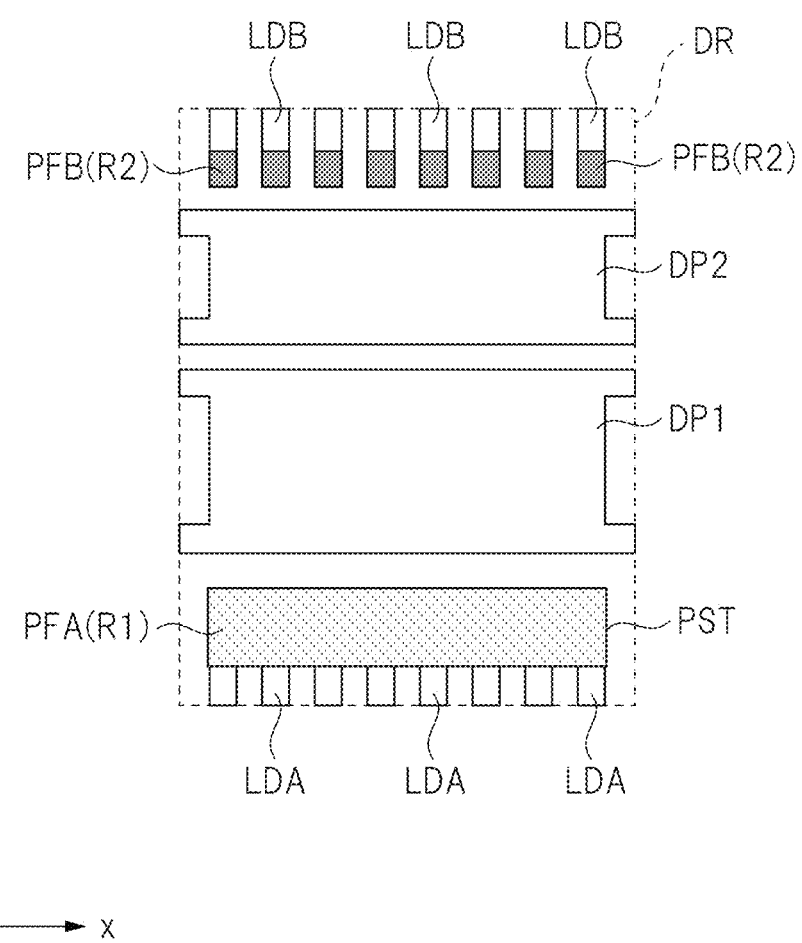
FIG. 18 is a diagram showing a device region of FIG. 17 to be enlarged.

FIG. 18 is a schematic diagram showing one enlarged device region DR of the plurality of device regions DR formed in the lead frame LF.

As shown in FIG. 18, the die pad DP1, the die pad DP2, the plurality of leads LDA arranged in the x direction and the plurality of leads LDB arranged in the x direction are formed in one device region DR. In this case, the plurality of leads LDA, the die pad DP1, the die pad DP2 and the plurality of leads LDB are arranged in this order in the y direction crossing the x direction.

Then, the plurality of leads LDA are unified with the post portion PST made of a part of the first region R1 where the nickel plating film PFA is formed. In other words, the plurality of leads LDA are connected to one another through a part of the first region R1 of the frame member. Therefore, each of the plurality of leads LDA includes a part of the first region R1 but does not include a part of the second region R2.

On the other hand, each of the plurality of leads LDB is formed to include, as its end, a part of the second region R2 where the silver plating film PFB is formed. Therefore, each of the plurality of leads LDB includes a part of the second region R2 but does not include a part of the first region R1.

A step of manufacturing the package structure PKG1 by using the lead frame LF including the plurality of device regions DR formed therein will be explained below to focus on one device region DR.

Figure 19:
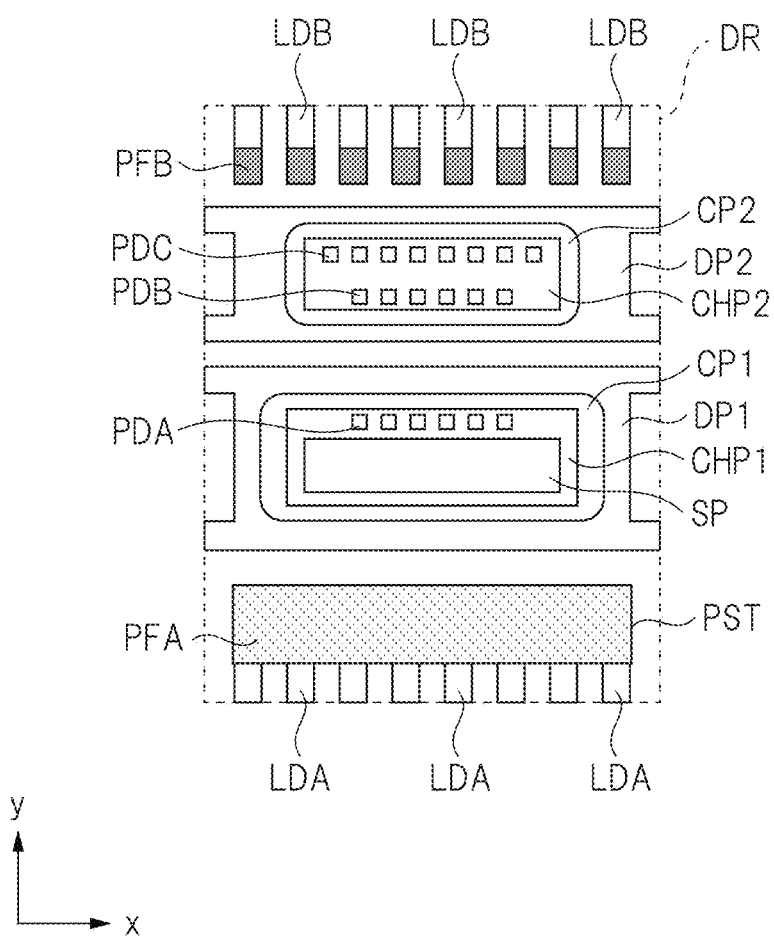
FIG. 19 is a diagram showing a step of manufacturing the semiconductor device, continued from FIG. 18.

First, as shown in FIG. 19, the semiconductor chip CHP1 including the power transistor formed thereon is mounted on the die pad DP1. Specifically, the conductive bonding member CP1 made of the silver past, the solder or others is applied on the die pad DP1, and then, the semiconductor chip CHP1 is mounted on the die pad DP1 through this conductive bonding member CP1. Also, the semiconductor chip CHP2 including the control circuit formed thereon is mounted on the die pad DP2. Specifically, the conductive bonding member CP2 made of the silver past, the solder or others is applied on the die pad DP2, and then, the semiconductor chip CHP2 is mounted on the die pad DP2 through this conductive bonding member CP2.

Figure 20:
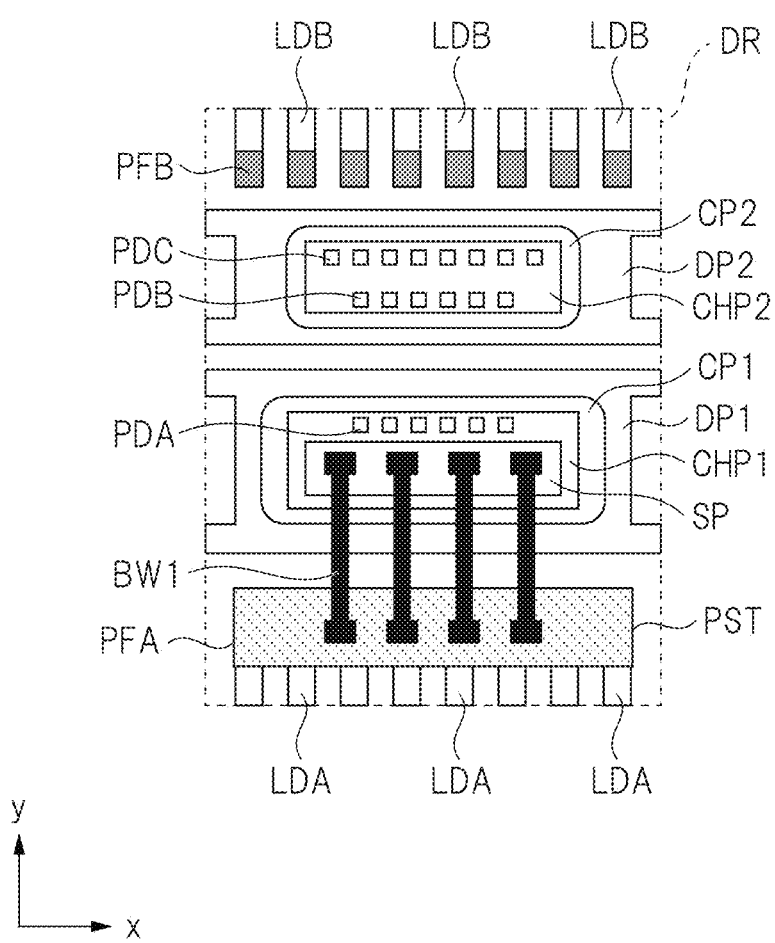
FIG. 20 is a diagram showing a step of manufacturing the semiconductor device, continued from FIG. 19.

Next, as shown in FIG. 20, the source pad SP formed on the surface of the semiconductor chip CHP1 and the post portion PST (a part of the first region) where the nickel plating film PFA is formed are connected to each other by the plurality of bonding wires BW1. In this case, each of the plurality of bonding wires BW1 is made of a material containing aluminium as a main component.

Figure 21:
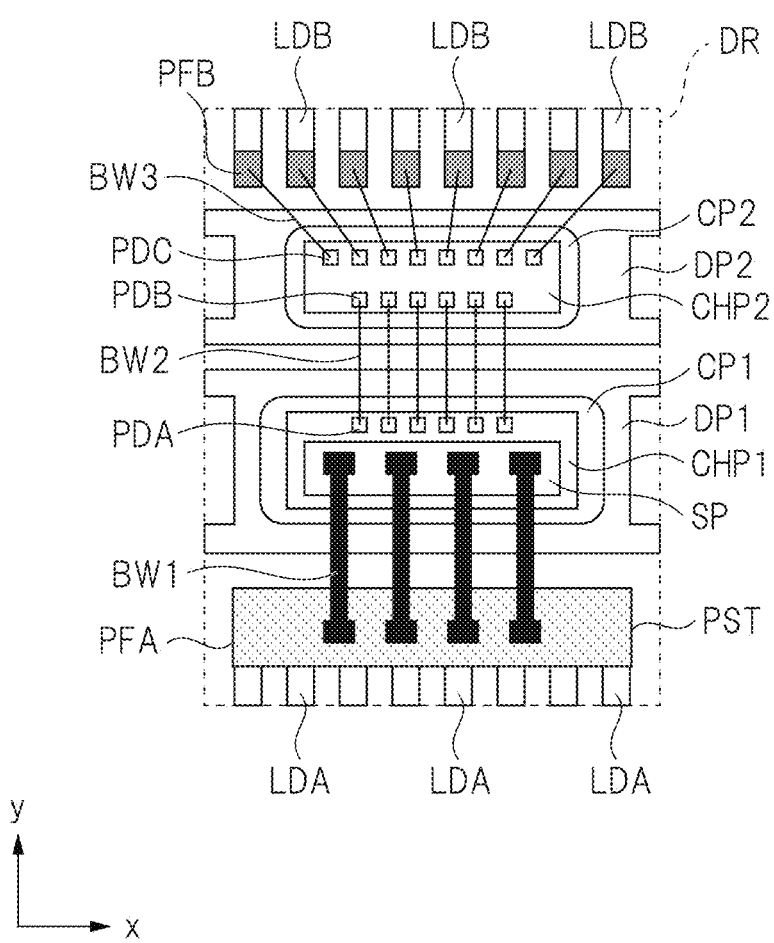
FIG. 21 is a diagram showing a step of manufacturing the semiconductor device, continued from FIG. 20.

Subsequently, as shown in FIG. 21, the pad PDA formed on the surface of the semiconductor chip CHP1 and the pad PDB formed on the surface of the semiconductor chip CHP2 are connected to each other by the bonding wire BW2. The pad PDC formed on the surface of the semiconductor chip CHP2 and one end of the lead LDB where the silver plating film PFB is formed are connected to each other by the bonding wire BW3. In this case, each of the bonding wire BW2 and the bonding wire BW3 is made of a material containing gold as a main component.

As described above, the power transistor is formed on the semiconductor chip CHP1, and the control circuit for the power transistor is formed on the semiconductor chip CHP2. The bonding wire BW1 is electrically connected with the source pad SP of the semiconductor chip CHP1 electrically connected to a source of the power transistor. In this case, the plurality of leads LDA are connected to one another through a part of the first region R1 of the frame member, and the diameter of the bonding wire BW1 is larger than each diameter of the bonding wire BW2 and the bonding wire BW3. In this manner, an ON resistance of the source to be an output route can be reduced.

Figure 22:
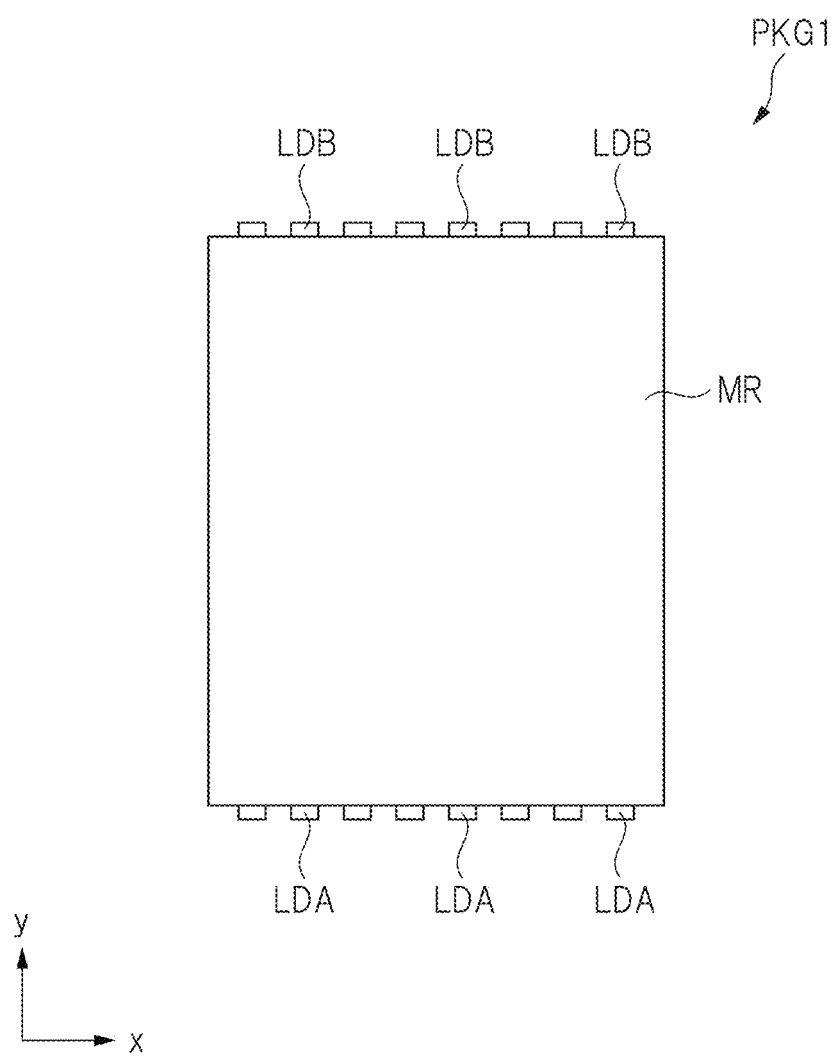
FIG. 22 is a diagram showing a step of manufacturing the semiconductor device, continued from FIG. 21.

Then, as shown in FIG. 22, a resin sealing (molding) process is performed to the device region DR to form the sealing body MR. Specifically, at least the semiconductor chip CHP1, the semiconductor chip CHP2, the post portion PST (a part of the first region), a part of each of the plurality of leads LDA, a part of each of the plurality of leads LDB including one end (a part of the second region) and the plurality of bonding wires BW1 to BW3 are sealed by the sealing body MR.

Then, a plating film is formed on the other portion of each of the leads LDA and LDB exposed from the sealing body MR as necessary. Next, in the outside of the sealing body MR, the leads LDA and LDB are cut at each predetermined position. Also, a suspension lead connected to each of the die pads DP1 and DP2 is cut at a predetermined position.

The package structure PKG1 can be manufactured as described above.

Features of Embodiment

Next, features of the present embodiment will be explained.

First, as described above, the premise of the basic idea of the present embodiment is the usage of the "stripe plating method", and the basic idea is the separation of the plurality of leads into the first lead group where the nickel plating film is formed and the second lead group where the silver plating film is formed.

Accordingly, in order to embody this basic idea, the present embodiment adopts so-called "SON package (Small Outline Non-leaded package)" or "SOP package (Small Outline package)" as the package structure of the semiconductor device.

Specifically, for example, as shown in FIG. 9, in the package structure PKG1 including the sealing body MR including the first side S1 extending in the x direction and the second side S2 facing the first side S1 and extending in the x direction, the present embodiment adopts a configuration in which the plurality of leads LDA is arranged along the first side S1 while the plurality of leads LDB is arranged along the second side S2. This configuration is achieved by the "SON package" or the "SOP package".

Therefore, as shown in FIG. 9, the plurality of leads LDA unified with the post portion PST where the nickel plating film PFA is formed and the plurality of leads LDB including one end where the silver plating film PFB is formed can be separately formed. This means that the relative positional shift between the nickel plating film PFA and the silver plating film PFB is no problem.

The premise of the present embodiment is the usage of the "SON package" or the "SOP package" as the package structure of the semiconductor device, and the basic idea is embodied by the achievement of the method of manufacturing the semiconductor device using the following "stripe plating method". Specifically, for example, in the frame member FM including the first region R1 and the second region R2 that are extending in the x direction in parallel to each other while being spaced apart from each other, the nickel plating film PFA is formed in the first region R1 by the "stripe plating method", and then, the silver plating film PFB is formed in the second region R2 by the "stripe plating method". Then, by the stamping process to the frame member FM including the first region R1 where the nickel plating film PFA is formed and the second region R2 where the silver plating film PFB is formed, the lead frame LF including the leads LDA and the leads LDB is formed. In this case, the lead frame LF includes the first lead group (the plurality of leads LDA) resulted from the stamping process to the first region R1 and the second lead group (the plurality of leads LDB) resulted from the stamping process to the second region R2, and only the nickel plating film PFA is formed in the post portion PST unified with the plurality of leads LDA while only the silver plating film PFB is formed in each of the plurality of leads LDB (see FIGS. 11 to 18).

As described above, the features of the present embodiment are the usage of the "SON package" or the "SOP package" as the package structure of the semiconductor device in order to embody the basic idea, and the usage of the method of manufacturing the semiconductor device shown in FIGS. 11 to 18 using the "stripe plating method" as the method of manufacturing this package structure.

In this manner, according to the features of the present embodiment, as shown in FIG. 9, the bonding wire BW1 containing aluminium as a main component can be connected to the post portion PST where the nickel plating film PFA is formed. On the other hand, the bonding wire BW3 containing gold as a main component can be connected to the lead LDB including one end where the silver plating film PFB is formed. In this case, in the present embodiment, the lead LDA unified with the post portion PST where the nickel plating film PFA is formed and the lead LDB including one end where the silver plating film PFB is formed are separately arranged in the facing first side S1 and second side S2 of the sealing body MR. Therefore, the relative positional shift between the nickel plating film PFA and the silver plating film PFB is no problem. Therefore, according to the present embodiment, the wire peeling and the silver migration due to the relative positional shift between the nickel plating film PFA and the silver plating film PFB can be suppressed. As a result, the reliability of the semiconductor device (package structure) can be improved.

In other words, the related art adopts, for example, so-called "TO package" in which the semiconductor chip CHP1 and the semiconductor chip CHP2 are layered while the leads LD1 to LD7 are arranged along only one side of the sealing body MR as shown in FIG. 6. Therefore, when the related art adopts the "stripe plating method", two types of plating films that are the nickel plating film and the silver plating film are necessarily formed in one lead. As a result, when the related art adopts the "stripe plating method" capable of reducing the manufacture cost, the relative positional shift between the nickel plating film and the silver plating film appears as the problem. This point is a new finding found by the present inventors.

As a result of the present inventors' studies focusing on this new finding, it has been found (as the basic idea) that the relative positional shift between the nickel plating film and the silver plating film in the case of the usage of the "stripe plating method" is no problem if the first lead group where the nickel plating film is formed and the second lead group where the silver plating film is formed are formed as different lead groups while the first lead group and the second lead group are arranged along different sides of the sealing body configuring the package structure. Then, as the features of the present embodiment, the present inventors has thought up that the basic idea is embodied in the "SON package" or the "SOP package" by the method of manufacturing the semiconductor device shown in FIGS. 11 to 18 using the "stripe plating method".

In consideration of this, it can be said that the thinking up of the basic idea is motivated by the new finding found by the present inventors, and it can be said that the thinking up of the features of the present embodiment is motivated by this basic idea. Therefore, it can be said that the new finding found by the present inventors and the thinking up of the basic idea based on this finding are significant for the thinking up of the features of the present embodiment.

Further, in the thinking up of the specific features of the present embodiment from the basic idea, the present inventors also have studied on adoption of so-called "QFN package (Quad Flat Non-leaded Package)" or "QFP package (Quad Flat Package)", but have not adopted it. Therefore, a reason for this will be also explained.

Figure 23:
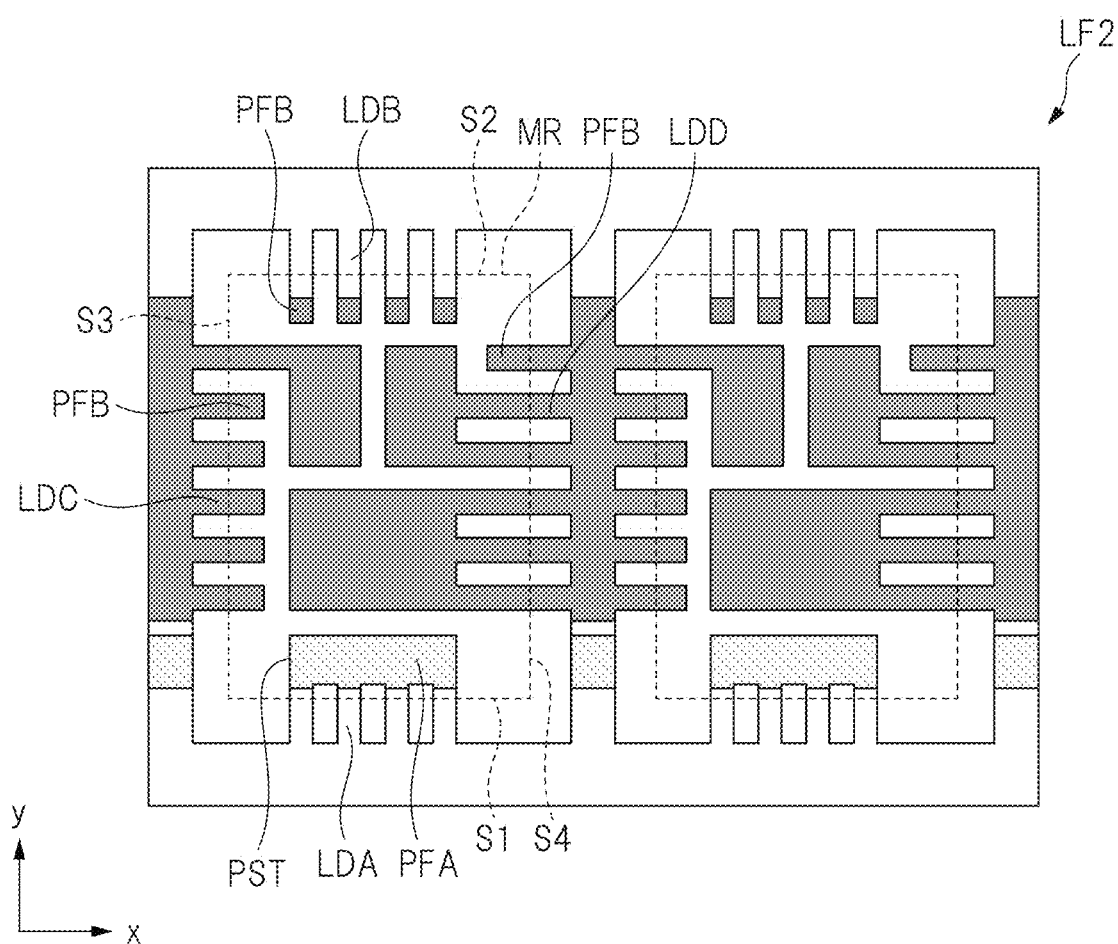
FIG. 23 is a diagram for explaining a study technique.

The "QFN package" or the "QFP package" is a package structure in which the leads is arranged along four sides of the sealing body. For example, FIG. 23 is a schematic diagram showing a lead frame LF2 for forming the "QFN package" or the "QFP package". In FIG. 23, a region shown with a broken line represents a formation region of the sealing body MR, and the sealing body MR has the first side S1 extending in the x direction, the second side S2 facing the first side S1, the third side S3 extending in the y direction and the fourth side S4 facing the third side S3. In this case, as shown in FIG. 23, the lead LDA is arranged along the first side S1, and the lead LDB is arranged along the second side S2. Further, the lead LDC is arranged along the third side S3, and the lead LDD is arranged along the fourth side S4.

In this case, in the lead frame LF2 for forming the "QFN package" or the "QFP package", the nickel plating film PFA is formed in the post portion PST unified with the lead LDA while the silver plating film PFB is formed in the leads LDB to LDD.

Figure 24:
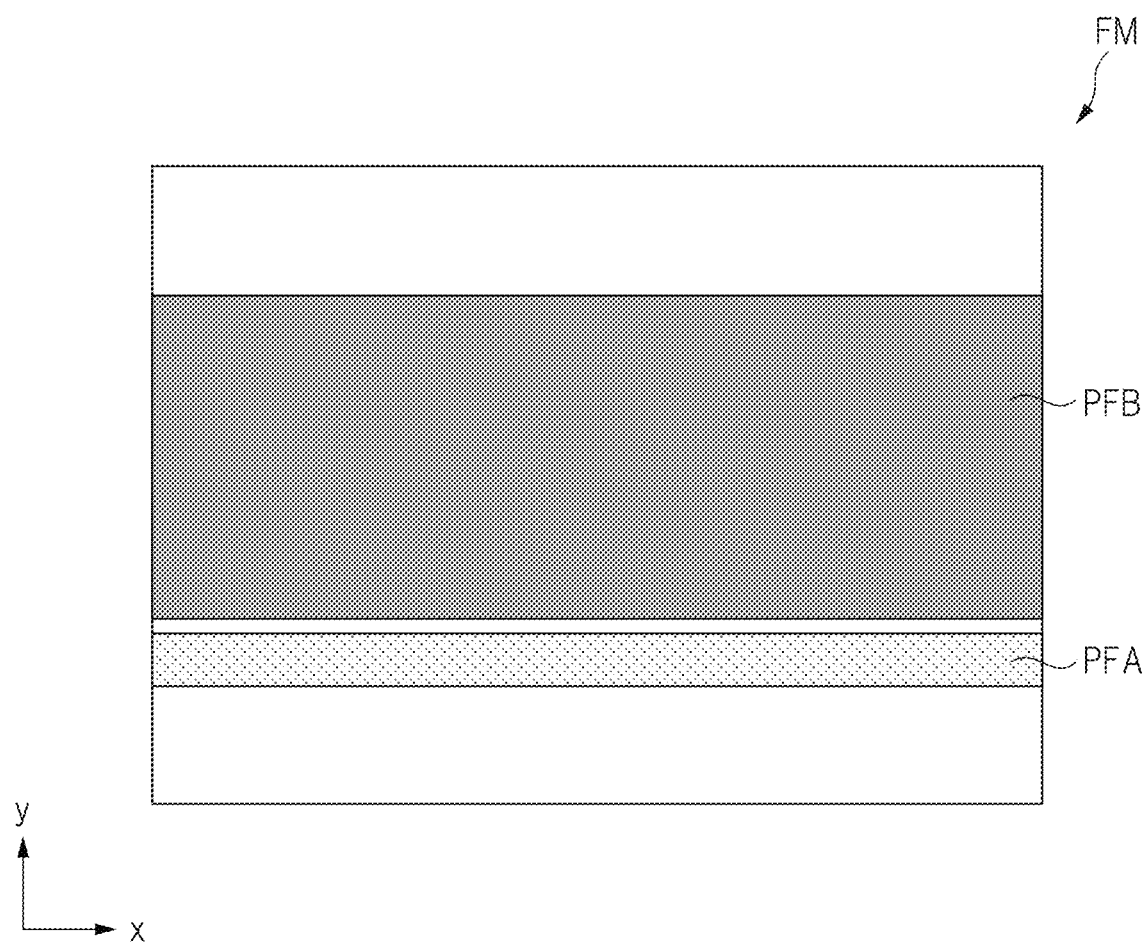
FIG. 24 is a diagram for explaining a study technique.

In this case, in consideration of the usage of the "stripe plating method", the nickel plating film PFA and the silver plating film PFB are formed in the frame member FM as shown in FIG. 24, and then, the stamping process is performed to provide the lead frame LF2 shown in FIG. 23. In this manner, in the lead frame LF2 shown in FIG. 23, the nickel plating film PFA is formed in the post portion PST unified with the lead LDA while the silver plating film PFB is formed in one end of the lead LDB and the entire of the leads LDC and LDD.

Figure 25:
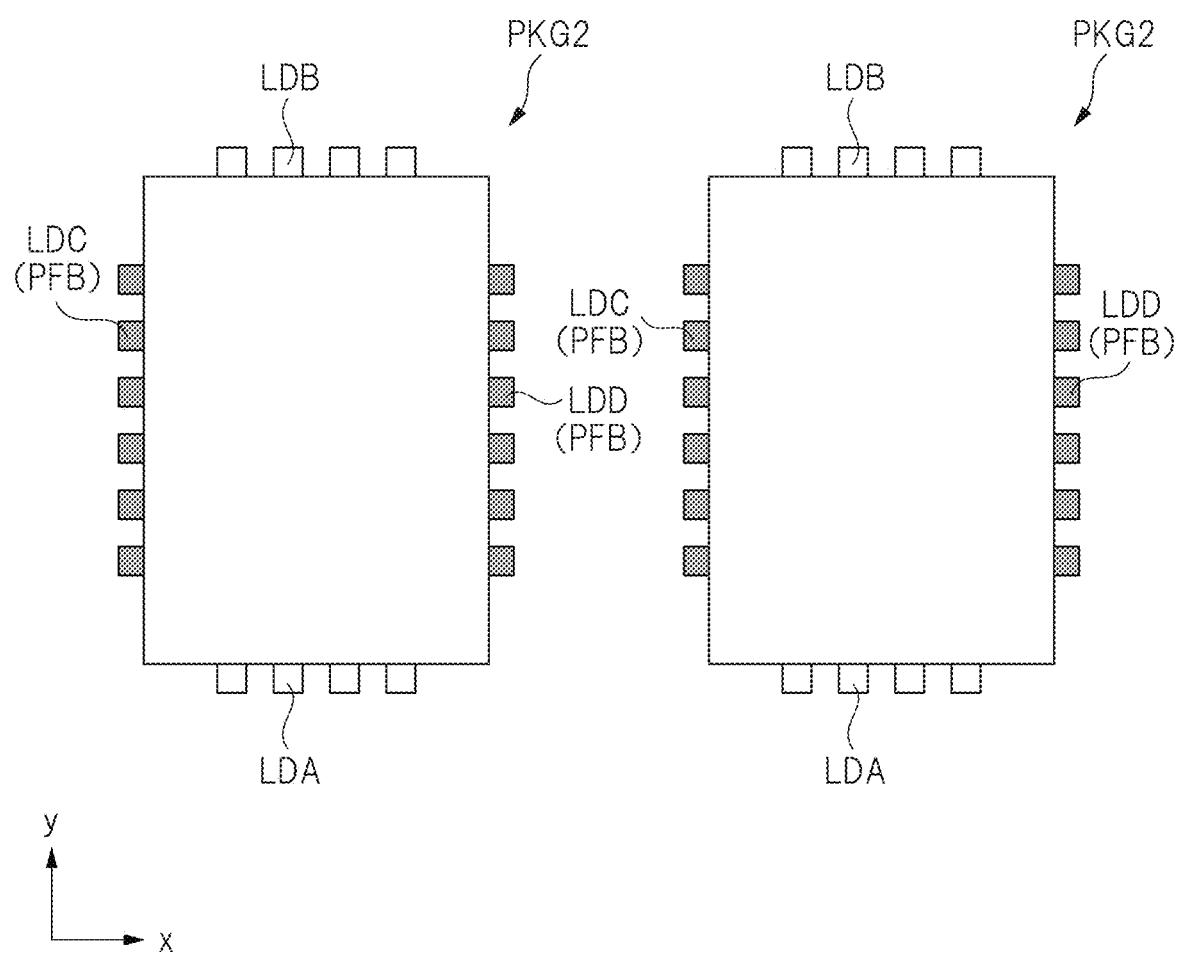
FIG. 25 is a diagram for explaining a study technique.

Then, the package structure PKG2 shown in FIG. 25 is manufactured from the lead frame LF2 shown in FIG. 23. In this case, since the silver plating film PFB is formed in the entire surfaces of the leads LDC and LDD, the silver plating film PFB is undesirably formed in the surfaces of the leads LDC and LDD exposed from the package structure PKG2 in the package structure PKG2 shown in FIG. 25. As a result, the risk of the occurrence of the silver migration arises. And, the occurrence of the silver migration in the leads LDC and LDD causes a risk of, for example, the occurrence of short circuit failure between adjacent leads.

As described above, when the lead frame LF2 for forming the "QFN package" or the "QFP package" is manufactured by the "stripe plating method", the silver plating film PFB is undesirably formed in the entire surfaces of the leads LDC and LDD since there are the leads LDC and LDD extending in the extension direction (x direction) of the silver plating film PFB. As a result, the silver plating film PFB is undesirably formed even in the surfaces of the leads LDC and LDD exposed from the package structure PKG2, which results in increase of the risk of the occurrence of short circuit failure due to the silver migration.

Because of the above-described reason, the "QFN package" or the "QFP package" is not adopted as the package structure for embodying the basic idea. On the other hand, the "SON package" or the "SOP package" adopted in the present embodiment includes no lead extending in the extension direction (x direction) of the silver plating film PFB, and, as a result, there is no lead including the silver plating film PFB formed on its entire surface as different from the "QFN package" or the "QFP package". Therefore, in the "SON package" or the "SOP package", the potential of the occurrence of short circuit failure due to the silver migration can be reduced. Therefore, the present embodiment adopts not the "QFN package" or the "QFP package" but the "SON package" or the "SOP package" as the package structure for embodying the basic idea.

In the foregoing, the invention made by the present inventors has been concretely described on the basis of the embodiments. However, it is needless to say that the present invention is not limited to the foregoing embodiments, and various modifications can be made within the scope of the present invention.

In the present embodiment, the package structure PKG1 having the configuration in which the bottom surface of the die pad DP1 and the bottom surface of the die pad DP2 are exposed from the back surface of the sealing body MR has been explained. However, the technical idea of the present embodiment is not limited to this, and is also variously applicable to a package structure having a configuration in which, for example, the bottom surface of the die pad DP1 and the bottom surface of the die pad DP2 are covered with the sealing body MR. Note that the "bottom surface of the die pad" is defined as a surface opposite to the chip mounting surface (top surface) on which the semiconductor chip is mounted.

In the above-described embodiment, the explanation has been made on the condition that a power MOSFET is used as the power transistor formed on the semiconductor chip. However, the technical idea of the above-described embodiment is not limited to this, and is also variously applicable to a semiconductor device using, for example, an IGBT (Insulated Gate Bipolar Transistor) as the power transistor.

The above-described embodiment includes the following aspect.

A semiconductor device includes as follows:
a first die pad;
a second die pad;
a first semiconductor chip mounted on the first die pad;
a second semiconductor chip mounted on the second die pad;
a plurality of first leads unified with a post portion in which a first plating film is formed;
a plurality of second leads including one end in each of which a second plating film is formed;
a first conductive member connecting the first semiconductor chip and the post portion;
a second conductive member connecting the second semiconductor chip and the one end; and
a sealing body sealing at least the first semiconductor chip, the second semiconductor chip, the post portion, a part of each of the plurality of first leads, a part of each of the plurality of second leads including the one end, the first conductive member and the second conductive member.

In this case,
the sealing body includes:
a first side extending in the first direction; and
a second side facing the first side, the plurality of first leads is arranged along only the first side, the plurality of second leads is arranged along only the second side, and the plurality of first leads, the first die pad, the second die pad and the plurality of second leads are arranged in this order along a second direction crossing the first direction.

What is claimed is:

1. A method of manufacturing a semiconductor device, comprising steps of:
   (a) preparing a frame member including a first region and a second region, the first region and the second region being extending in a first direction in parallel to each other while being spaced apart from each other;
   (b) forming a first plating film in the first region;
   (c) forming a second plating film in the second region, the second plating film being different in a type from the first plating film; and
   (d) after the steps (b) and (c), performing a stamping process to the frame member, thereby forming a plurality of device regions each including a part of the first region and a part of the second region,
   wherein each of the plurality of device regions formed in the step (d) includes:
      a first die pad;
      a second die pad;
      a plurality of first leads arranged in the first direction; and
      a plurality of second leads arranged in the first direction,
   wherein the plurality of first leads, the first die pad, the second die pad and the plurality of second leads are arranged in a second direction crossing the first direction,
   wherein each of the plurality of first leads includes the part of the first region but does not include the part of the second region, and
   wherein each of the plurality of second leads includes the part of the second region but does not include the part of the first region.

2. The method of manufacturing the semiconductor device according to claim 1,
   wherein, in the step (b), the first plating film is formed over the plurality of device regions, and,
   wherein, in the step (c), the second plating film is formed over the plurality of device regions.

3. The method of manufacturing the semiconductor device according to claim 2, further comprising steps of:
   (e) after the step (d), mounting a first semiconductor chip on the first die pad;
   (f) after the step (d), mounting a second semiconductor chip on the second die pad;
   (g) after the steps (e) and (f), electrically connecting the first semiconductor chip with the plurality of first leads through a plurality of first conductive members, respectively;
   (h) after the steps (e) and (f), electrically connecting the second semiconductor chip with the plurality of second leads through a plurality of second conductive members, respectively; and
   (i) sealing at least the first semiconductor chip, the second semiconductor chip, the part of the first region and the part of the second region by a sealing body.

4. The method of manufacturing the semiconductor device according to claim 3,
   wherein the first plating film is a nickel plating film,
   wherein the second plating film is a silver plating film,
   wherein each of the plurality of first conductive members is a first bonding wire containing aluminium as a main component,
   wherein each of the plurality of second conductive members is a second bonding wire containing gold as a main component,
   wherein the step (g) is a step of electrically connecting the plurality of first conductive members with the plurality of first leads through the first plating film, respectively, and
   wherein the step (h) is a step of electrically connecting the plurality of second conductive members with the plurality of second leads through the second plating film, respectively.

5. The method of manufacturing the semiconductor device according to claim 4,
   wherein, after the step (d), the plurality of first leads is connected to one another through the part of the first region of the frame member, and
   wherein a diameter of the first bonding wire is larger than a diameter of the second bonding wire.

6. The method of manufacturing the semiconductor device according to claim 5,
   wherein a power transistor is formed in the first semiconductor chip,
   wherein a control circuit for the power transistor is formed in the second semiconductor chip, and
   wherein the first bonding wire is electrically connected with a source pad of the first semiconductor chip electrically connected to a source of the power transistor.

7. The method of manufacturing the semiconductor device according to claim 3, further comprising a step of:
   (j) after the steps (e) and (f) and before the step (i), electrically connecting the first semiconductor chip with the second semiconductor chip through a plurality of third conductive members.

8. The method of manufacturing the semiconductor device according to claim 3,
   wherein, after the step (i), a bottom surface of the first die pad and a bottom surface of the second die pad are exposed from the sealing body.

9. The method of manufacturing the semiconductor device according to claim 3,
   wherein, after the step (i), a bottom surface of the first die pad and a bottom surface of the second die pad are covered with the sealing body.

* * * * *